US006927998B2

(12) United States Patent
Takeuchi et al.

(10) Patent No.: US 6,927,998 B2
(45) Date of Patent: Aug. 9, 2005

(54) NONVOLATILE SEMICONDUCTOR MEMORY DEVICE CAPABLE OF REDUCING THRESHOLD VOLTAGE VARIATIONS OF MEMORY CELLS DUE TO CAPACITANCE COUPLING

(75) Inventors: Yuji Takeuchi, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/928,193

(22) Filed: Aug. 30, 2004

(65) Prior Publication Data

US 2005/0023601 A1 Feb. 3, 2005

Related U.S. Application Data

(63) Continuation of application No. 10/278,854, filed on Oct. 24, 2002, now Pat. No. 6,806,525.

(30) Foreign Application Priority Data

Oct. 24, 2001 (JP) ........................................ 2001-326900
Feb. 4, 2002 (JP) ........................................ 2002-027436

(51) Int. Cl.$^7$ .............................................. G11C 16/10
(52) U.S. Cl. ............................ 365/185.02; 365/185.03; 365/185.17
(58) Field of Search ........................ 365/185.03, 185.02, 365/185.2, 185.17, 185.05

(56) References Cited

U.S. PATENT DOCUMENTS

| 5,430,672 | A | 7/1995 | Kuwabara et al. ........... 365/149 |
| 6,021,077 | A | 2/2000 | Nakaoka ...................... 365/221 |
| 6,222,756 | B1 | 4/2001 | Lee ............................. 365/145 |
| 6,418,052 | B1 | 7/2002 | Shibata et al. .......... 365/185.12 |
| 6,643,179 | B2 * | 11/2003 | Campardo et al. ...... 365/185.21 |
| 6,809,961 | B2 * | 10/2004 | Micheloni et al. ...... 365/185.03 |
| 6,839,284 | B1 * | 1/2005 | Yang et al. ............ 365/185.29 |

FOREIGN PATENT DOCUMENTS

JP 4-276393 10/1992

* cited by examiner

*Primary Examiner*—Andrew Q. Tran
(74) *Attorney, Agent, or Firm*—Oblon, Spivak, McClelland, Maier & Neustadt, P.C.

(57) ABSTRACT

A semiconductor device with a non-volatile memory, having: first to fourth memory cells arranged in a first direction; a first bit line extending over the first memory cell in a second direction and connected to the second memory cell; a second bit line extending over the second memory cell in the second direction and connected to the first memory cell; a third bit line extending over the third memory cell in the second direction and connected to the third memory cell; and a fourth bit line extending over the fourth memory cell in the second direction and connected to the fourth memory cell.

4 Claims, 29 Drawing Sheets

Threshold voltage *(V)*

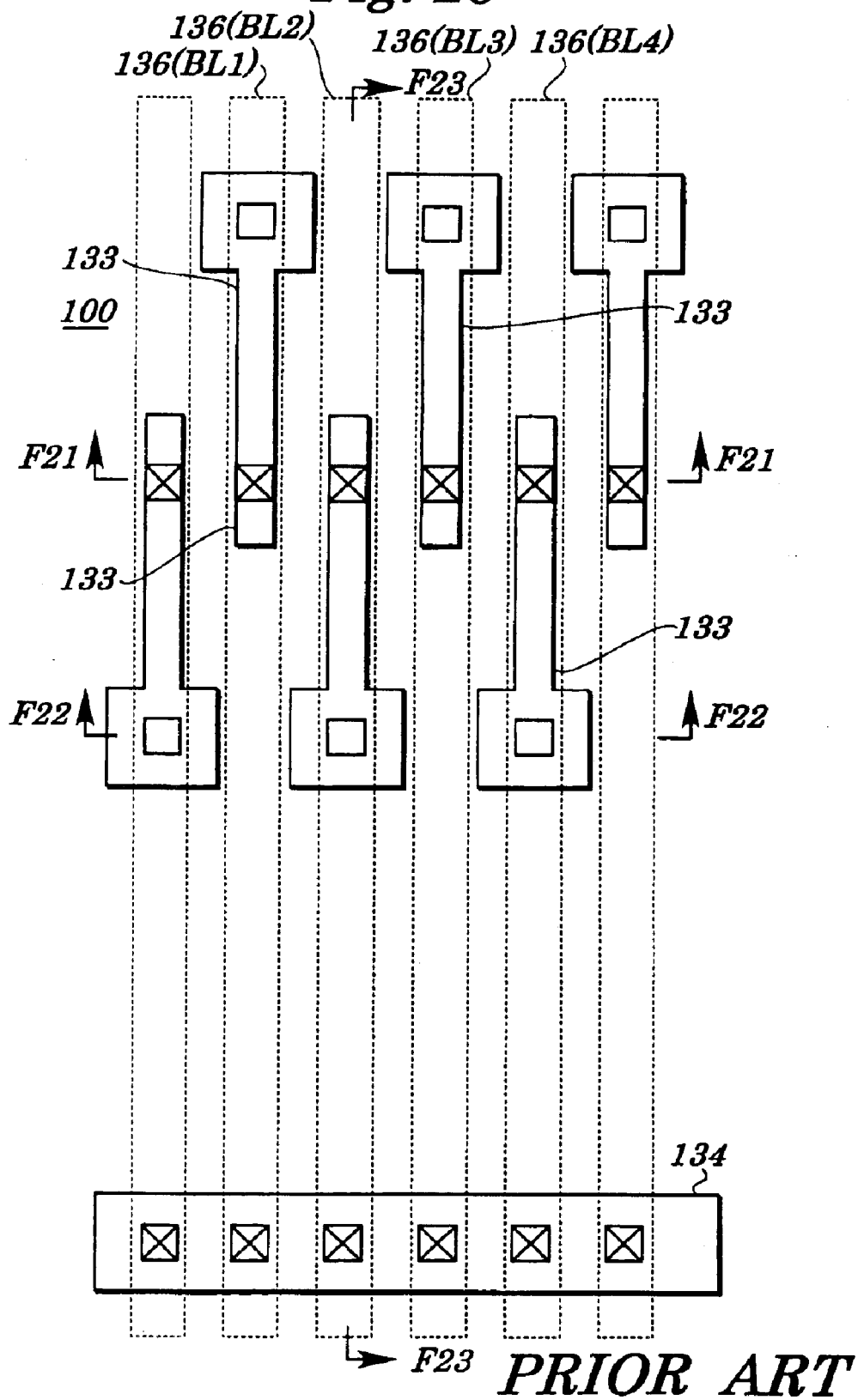

PRIOR ART

NONVOLATILE SEMICONDUCTOR MEMORY DEVICE CAPABLE OF REDUCING THRESHOLD VOLTAGE VARIATIONS OF MEMORY CELLS DUE TO CAPACITANCE COUPLING

CROSS-REFERENCE TO RELATED APPLICATIONS

This application is a continuation application of U.S. application Ser. No. 10/278,854, filed Oct. 24, 2002, now U.S. Pat. No. 6,806,525 and is based upon and claims the benefit of priorities under 35 U.S.C. § 119 to Japanese Patent Applications No. 2001-326,900 filed on or around Oct. 24, 2001 and No. 2002-027,436, filed on or around Feb. 4, 2002; the entire contents each of which are incorporated by reference herein.

BACKGROUND OF THE INVENTION

1. Field of the Invention

The present invention relates to a semiconductor device and an operation thereof, and more particularly to a semiconductor device including a non-volatile memory and an operation thereof.

2. Description of the Related Art

NAND type EEPROMs (electrically erasable programmable read only memory) are popular as semiconductor devices which include electrically programmable and erasable non-volatile memories. FIG. 19 to FIG. 23 of the accompanying drawings show a structure of such a NAND type EEPROM, and FIG. 24 shows a circuit configuration of the NAND type EEPROM.

In the NAND type EEPROM, a memory array 100 is constituted by a plurality of memory cell units 101 arranged in the shape of a matrix. Each memory cell unit 101 includes eight memory cells 102 which are connected in series in a row. Generally speaking, the memory cell 102 can store 1-bit data while the memory cell unit 101 can store 1-byte data.

Referring to FIG. 21 to FIG. 23, the NAND type EEPROM is provided on a main surface of a semiconductor substrate 110 (i.e. a semiconductor chip), which is made of a silicon single crystal substrate. A plurality of memory cells 102 are positioned on the main surface (a well region, not shown) of the semiconductor substrate 110. The memory cells 102 are surrounded by an element isolate insulating film 111 at a gate width regulating area.

Each memory cell 102 includes: a channel forming region (the semiconductor substrate 110 or the well region); a first gate insulating film 121; a floating gate electrode (charge storing section) 122 on the first gate insulating film 121; a second gate insulating film 123 on the floating gate electrode 122; a control gate electrode 124 on the second gate insulating film 123; and a pair of semiconductor regions 125 functioning as source and drain regions. In other words, each memory cell 102 is constituted by an n-channel conductivity type field effect transistor including the floating gate electrode 122. In the memory cell unit 101, the semiconductor regions 125, i.e. a source or drain region, of one memory cell 102 in a row are integral with semiconductor regions 125 of another memory cell 102 which is adjacent in the same row. Referring to FIG. 19 and FIG. 22, the control gate electrode 124 of one memory cell 102 in a column is integral with a control gate electrode 124 of another memory cell 102 which is adjacent in the same column, thereby constituting a word line 124WL extending in the column and the row.

A cell selecting transistor 105 is provided for the memory cells 102 at one end of the memory cell unit 101 (i.e., at the upper part in FIG. 19, and at the left side in FIG. 23). Further, a cell selecting transistor 106 is provided for the memory cell at the other end of the memory cell unit 101 (i.e., at the lower part in FIG. 19, and at the right side in FIG. 23).

The cell selecting transistors 105 and 106 are n-channel conductivity type field effect transistors. The cell selecting transistor 105 includes a channel forming region, a gate insulating film 151 on the channel forming region, a gate electrode 152 on the gate insulating film. 151, and a pair of n-channel type semiconductor regions 155 functioning as a source or drain region. The gate electrode 152 is integral with a gate electrode 152 of an adjacent cell selecting transistor 105 in the same column, thereby constituting a cell selecting signal line 152S.

The cell selecting transistor 106 includes a channel forming region, a gate insulating film 161 on the channel forming region, a gate electrode 162 on the gate insulating film 161, and a pair of n-channel type semiconductor regions 165 functioning as a source or drain region. The gate electrode 162 is integral with a gate electrode 162 of an adjacent cell selecting transistor 106 in the same column, thereby constituting a cell selecting signal line 162S.

On the memory cell unit 101, a plurality of bit lines 136 are provided in the column and extend in the row which intersects the word line 124WL. A plurality of sub-bit lines 133 under the bit lines 136 are connected to the semiconductor regions 155 via connecting hole wirings 131. The sub-bit lines 133 are formed on a first wiring layer of an inter-level isolation layer 130. The bit lines 136 are formed on a second wiring layer of an inter-level isolation layer 135 extending over the sub-bit lines 133. The bit lines 136 are connected to the semiconductor region 155 at one end of the cell selecting transistor 105 via the sub-bit lines 133 and connecting hole wirings 131.

Source lines 134 are provided on the first wiring layer of the inter-level isolation film 130 together with the sub-bit lines 133, and are connected via the connecting hole wiring 132 to one of the semiconductor regions 165 of the cell selecting transistor 106.

FIG. 25 to FIG. 27 show a structure of another NAND type EEPROM, which has essentially a circuit configuration identical to that shown in FIG. 24, but does not include sub-bit lines 133. Specifically, bit lines 136 are provided on a first wiring layer of an inter-level isolation film 130, and are connected to one of semiconductor regions 155 of a cell selecting transistor 105 via a connecting hole wiring 131. This NAND type EEPROM does not include source lines 134 but is provided with source lines 165S integral with one of semiconductor regions 165 of an adjacent cell selecting transistor 106 in the same column.

Operations of the foregoing NAND type EEPROMs will be described with reference to FIG. 28.

(1) First of all, existing data are erased in a memory cell array 100 of the NAND type EEPROM. Specifically, the data are simultaneously erased from the memory cells 102 in a selected memory block. For this purpose, 0V is applied to the control gate electrode 124 (the word line 124WL) while a high voltage $V_{PPW}$, e.g. 20V, is applied to the semiconductor substrate (well region) 110. An FN tunnel current flows to the first gate insulating film 121, and electrons are discharged from the floating gate electrode (charge storing section) 122 to the semiconductor substrate 110, so that a threshold voltage of the memory cell 102 becomes negative.

(2) Thereafter, data are written (step 170S) into the memory cells 102 connected to one word line 124WL. Specifically, the data are separately written into the memory cells 102 connected to even-numbered bit lines 136 (e.g. BL2, BL4, . . . ) and into the memory cells 102 connected to odd-numbered bit lines 136 (e.g. BL1, BL3, . . . ). For instance, the data are simultaneously written into a plurality of even-numbered memory cells 102 connected to the selected word line 124WL.

In order to write data "0" in the memory cells 102, i.e. in order to make the threshold voltage thereof positive, 0V is applied to the bit lines 136. On the other hand, in order to write data "1" in the memory cells 102, i.e. in order not to change the threshold value thereof, a writing voltage $V_{CC}$, e.g. 3V, is applied to the bit lines 136. When writing data in the memory cells 102 connected to even-numbered bit lines 136, the writing voltage $V_{CC}$ is applied to odd-numbered bit lines 136. Further, the writing voltage $V_{CC}$ is applied to the cell selecting signal lines 152S connected to the cell selecting transistor 105, and a writing voltage $V_{PASS}$, e.g. 10V, is applied to non-selected word lines 124WL. Still further, a high writing voltage $V_{PPW}$, e.g. 20V, is applied as pulses to the selected word line 124WL (step 171S).

In the memory cells 102 where data "0" is to be written, 0V is applied to the drain region (semiconductor region 125), the channel forming regions, and the source regions (semiconductor region 125), and a high voltage is applied between the channel forming regions and the control gate electrodes 124. Therefore, the FN tunnel current flows to the first gate insulating film 121, and electrons are introduced into the floating gate electrodes 122. Therefore, the threshold voltage of the memory cells 102 is made positive.

On the other hand, in the memory cells 102 where data "1" is to be written, the cell selecting transistors 105 are in a cutoff state. The potential of the channel forming regions is raised because of coupling capacitance caused by the voltage $V_{PASS}$ to the non-selected control gate 124, so that a moderate electric field is generated between the channel forming region and the control gate electrodes 124. Since no electrons are introduced to the floating gate electrodes 122 from the channel forming regions, the threshold voltage of the memory cells 102 does not change.

Further, the threshold voltage of the memory cells 102 connected to the odd-numbered bit lines 136 does not change while the data are being written into the memory cells 102 connected to the even-numbered bit lines 136.

(3) Once the high wiring voltage $V_{PPW}$ is applied to the selected word line 124WL, verification is performed in order to check the threshold voltage of the memory cells 102 where data "0" has been written has reached a specified value (step 172S). For this purpose, the reading voltage $V_{CC}$, e.g. 3V, is applied to the even-numbered bit lines 136, 0V is applied to the odd-numbered bit lines 136, 0V is applied also to the control gate electrode 124 (the word line 124WL) connected to the selected memory cells 102, and the reading voltage $V_{CC}$ is applied to other word lines 124WL and cell selecting signal lines 152S. Further, it is also verified whether or not a current flows from the bit lines 136 via the memory cells 102 during the application of the verifying voltage. If the current flows in this state, the threshold voltage of the selected memory cells 102 does not become high enough, i.e. the data writing has not been completed. In such a case, the data writing will be repeated.

Conversely, when no current flows, the data writing has been completed. The 0V at the bit lines 136 is switched over to the voltage $V_{CC}$, thereby prohibiting further data writing, and preventing the threshold voltage from varying in the memory cells 102.

Thereafter, the data will be repeatedly and similarly written into all of the memory cells 102 connected to the selected word lines 124WL and the odd-numbered bit lines 136 (step 173S).

(4) In the similar manner, the data will be written into the memory cells 102 connected to the odd-numbered bit lines 136 (steps 175S and 176S). The written data are verified (step 177S). Further, the data are repeatedly written into all of the memory cells 102 connected to the selected word line 124WL and the odd-numbered bit lines 136 (178S).

(5) The data will be read in the manner similar to that of the verification. The reading voltage $V_{CC}$, e.g. 3V, is applied to the bit lines 136, 0V is applied to the control gate electrode 124 (word line 124WL) connected to the selected memory cells 102, and the reading voltage $V_{CC}$ is applied to other word lines 124WL and cell selecting signal lines 152. Thereafter, it is checked whether or not a current flows from the bit lines 136 via the memory cells 102. Similarly to data writing, data reading is separately performed for the memory cells 102 connected to the even-numbered bit lines 136 and for the memory cells 102 connected to the odd-numbered bit lines 136. When reading the data from the memory cells 102 connected to the even-numbered bit lines 136, 0V is applied to the odd-numbered bit lines 136. Conversely, in order to read the data from the memory cells connected to the odd-numbered bit lines 136, 0V is applied to the even-numbered bit lines 136.

Therefore, it is possible to prevent erroneous data reading due to interference between adjacent bit lines in a row through separate data reading for the memory cells 102 connected to the odd- and even-numbered bit lines 136, respectively, as will be described hereinafter.

During the data reading, the bit lines 136 are charged, and the non-selected control gate electrodes 124 and non-selected word lines 124WL are activated. The data are recognized depending upon whether the charged voltage is lowered in the bit lines 136. Specifically, if the charged voltage is lowered, the data "0" is recognized. If not, data "1" is recognized.

The following describe how the data are read from the memory cells 102 without dividing them into those connected to the even-numbered and odd-numbered bit lines 136. It is assumed here that, as shown in FIG. 29, the bit lines 136 (BL1, BL2, and BL3) are juxtaposed, and data "0" has been stored in the memory cells 102 connected to the bit lines 136 (BL1 and BL3) while the data "1" has been stored in the memory cell 102 connected to the bit line (BL2).

During the data reading, the charging potential of the bit lines 136 (BL1 and BL3) should be ideally lowered while the charging potential of the bit line 136 (BL2) should ideally remain unchanged. There is coupling capacitance $C_{BL12}$ between the adjacent bit lines 136 (BL1 and BL2) while there is coupling capacitance $C_{BL23}$ between the adjacent bit lines 136 (BL2 and BL3). If the charging potential is lowered at the bit lines 136 (BL1 and BL3), the charging potential of the bit line 136 (BL2) is slightly lowered due to coupling noises. As a result, the data stored in the memory cells 102 connected to the bit line 136 (BL2) would be erroneously recognized to be data "1". Further, the more micro spaces between the bit lines 136, the more coupling noises would be increased, and the more remarkable the erroneous data reading.

The following reference is known in order to effectively overcome the foregoing problems of the related art: "A Quick Intelligent Page-Programming Architecture and a Shielded Bit line Sensing Method for 3V-only NAND Flash Memory", by T. Tanaka, et al., (IEEE J. Solid-State Circuits, vol. 29, no. 11, pp. 1366–1378, November 1994). In this bit line shielding technique, each second bit line is read during page programming, and bit lines which are not read are grounded, thereby reducing coupling noises.

With the foregoing NAND type EEPROMs, it is possible to reduce coupling noises between adjacent bit lines by utilizing the bit line shielding technique, but the following problems seem remain unsolved.

(1) The more micro-fabricated NAND type EEPROMs, the more reduced spaces between floating gate electrodes 122 of adjacent memory cells 102. Therefore, the coupling capacitance between the floating gate electrodes 122 tends to become more influential. Referring to FIG. 30, the coupling capacitance $C_{FGR}$ is produced between the floating gate electrodes 122 of adjacent memory cells 102 in the same row. Further, the coupling capacitance $C_{FGC}$ is produced between the floating gate electrodes 122 of adjacent memory cells 102 in the same column, as shown in FIG. 31.

If a threshold voltage of a memory cell 102 which is adjacent to a particular memory cell 102 varies, a threshold voltage of the particular memory cell 102 seems to increase in response to the coupling capacitances $C_{FGR}$ and $C_{FGC}$. For instance, if the threshold voltage of the adjacent memory cell 102 becomes negative from positive, the threshold voltage of the particular memory cell 102 seems to become positive in response to this change. In other words, when the data writing is separately performed for the memory cells 102 connected to the even-numbered bit lines 136 and the memory cells 102 connected to the odd-numbered bit lines 136, the threshold voltage of the memory cell 102 where the data are written first will be affected by the coupling capacitances $C_{FGR}$ and $C_{FGC}$, and seems be changed in response to the threshold voltage of the memory cell 102 where the data are written later.

It is assumed here that the data are written into a memory cell 102 connected to an even-numbered bit line 136 at first and that data "0" is written into the particular memory cell 102. A threshold voltage of an adjacent memory cell 102 connected to an odd-numbered bit line 136 is negative (remains the same as that during the erasing). When data "0" is written into memory cells 102 which are connected to odd-numbered bit lines 136 and adjacent to the particular memory cell 102 on the opposite sides thereof (i.e. threshold voltages of the adjacent memory cells 102 are changed to positive from negative), the threshold voltage of the particular memory cell 102 is changed to positive in response to the coupling capacitances $C_{FGR}$ and $C_{FGC}$.

Variations of the threshold voltages of the memory cells 102 will result in variations of threshold voltages after the data writing, and cause erroneous operations of the NAND type EEPROMs. Further, there is a problem that along with the micro-fabrication, coupling capacitances between the floating gate electrodes 122 of adjacent memory cells 102 become serious not only in matrixes (in rows and columns) but also diagonally, which means that erroneous operations are also serious in the NAND type EEPROMs.

(2) In order to increase a storage capacity per memory cell, multiple-valued memory cells are being developed for NAND type EEPROMS, AND type EEPROMs and so on. With the multiple-valued memory cell, the threshold voltage is divided into four levels (quadruple) in place of two levels (binary), thereby increasing the storage capacity. The storage capacity and integration degree of the quadruple memory cell are doubled compared with those of binary memory cells. Needless to say, variations of threshold voltages after data writing should be reduced in order to realize multiple-value memory cells.

However, it has been very difficult to realize multiple-valued memory cells because coupling capacitances become strong between floating gate electrodes of adjacent memory cells as memory cells are being micro-fabricated, and because it is difficult to reduce variations of threshold voltages after data writing.

BRIEF SUMMARY OF THE INVENTION

According a first aspect of embodiment of the invention, there is provided a semiconductor device with a non-volatile memory, having: first to fourth memory cells arranged in a first direction; a first bit line extending over the first memory cell in a second direction and connected to the second memory cell; a second bit line extending over the second memory cell in the second direction and connected to the first memory cell; a third bit line extending over the third memory cell in the second direction and connected to the third memory cell; and a fourth bit line extending over the fourth memory cell in the second direction and connected to the fourth memory cell.

In accordance with a second aspect of embodiment of the invention, there is a semiconductor device with a non-volatile memory, having: first to fourth bit lines arranged in a first direction and extending in a second direction; and memory cell units including a plurality of memory cells which are provided under the first to fourth bit lines and are arranged in a second direction, wherein: the memory cells of (4n("n" is a natural number))th and (4n+1)th memory cell unit (or memory cell units), which is arranged in the second direction and is positioned under the first bit line, are connected to the second bit line; the memory cells of (4n)th and (4n+1)th memory cell unit (or memory cell units), which is arranged in the second direction and is positioned under the second bit line, are connected to the first bit line; the memory cells of (4n+2)th and (4n+3)th memory cell units, which are arranged in the second direction and are positioned under the third bit line, are connected to the third bit line; and the memory cells of (4n+2)th and (4n+3)th memory cell units, which are arranged in the second direction and is positioned under the fourth bit line, are connected to the fourth bit line.

According to a third aspect of embodiment of the invention, there is provided a semiconductor device with a non-volatile memory, having: first to fourth bit lines arranged in a first direction and extending in a second direction; memory cell units including a plurality of memory cells which are provided under the first to fourth bit lines and arranged in a second direction, wherein: the memory cells of (8n ("n" is a natural number))th and (8n+1)th memory cell unit (or memory cell units), which is arranged in the second direction and is positioned under the first bit line, are connected to the second bit line; the memory cells of (8n)th and (8n+1)th memory cell unit (or memory cell units), which are arranged in the second direction and are positioned under the second bit line, are connected to the first bit line; the memory cells of (8n+2)th and (8n+3)th memory cell units, which are arranged in the second direction and are positioned under the second bit line, are connected to the third bit line; the memory cells of (8n+2)th and (8n+3)th memory cell units, which are arranged in the second direction and are positioned under the third bit line, are connected to the second bit line; the memory cells of (8n+4)th and (8n+5)th memory cell units, which are arranged in the second direction and are positioned under the third bit line, are connected to the fourth bit line; the memory cells of (8n+4)th and (8n+5)th memory cell units, which are arranged in the second direction and are positioned under the fourth bit line, are connected to the third bit line; the memory cells of (8n+6)th and (8n+7)th memory cell units, which are arranged in the second direction and are positioned under the fourth bit line, are connected to the first bit line; and the memory cells of (8n+6)th and (8n+7)th memory cell units, which are arranged in the second direction and are positioned under the first bit line, are connected to the fourth bit line.

With a fourth aspect of embodiment of the invention, there is provided an operation of a semiconductor device which includes first to fourth memory cells arranged in a first direction, a first bit line extending over the first memory cell in a second direction and connected to the second memory cell, a second bit line extending over the second memory cell in the second direction and connected to the first memory cell, a third bit line extending over the third memory cell in the second direction and connected to the third memory cell, and a fourth bit line extending over the fourth memory cell in the second direction and connected to the fourth memory cell, the operation comprising: writing data into the second and third memory cells connected to the first and third bit lines; verifying the data written in the second and third memory cells; writing data into the first and fourth memory cells connected to second and fourth bit lines; and verifying data written in the first and fourth memory cells.

In accordance with a fifth aspect of embodiment of the invention, there is provided a semiconductor device with a non-volatile memory, having: a memory cell array including a plurality of memory cells, each of which has positive ternary or more data "m" and is arranged in the shape of a matrix; a plurality of word lines connected to the memory cells, extending over the memory cell arrays in a first direction, and arranged in a second direction; a plurality of bit lines connected to the memory cells, extending over the memory cell arrays in the second direction, and arranged in the first direction; a plurality of sense amplifiers provided for the bit lines on one to one basis; and a plurality of latch circuits provided for the sense amplifier on one to one basis.

According to a sixth aspect of embodiment of the invention, there is provided an operation of a semiconductor device which includes a non-volatile memory in which a plurality of memory cells are connected to bit lines and word lines, are arranged in the shape of a matrix and are capable of having positive ternary or more data "m" written therein, the operation comprising: initializing all of the memory cells; and writing data into the memory cells m−1 times, wherein data written after the initialization are sequentially added to the data written during the initialization.

BRIEF DESCRIPTION OF THE SEVERAL VIEWS OF THE DRAWINGS

FIG. 20 is a plan view of an essential part of wiring in the semiconductor device of FIG. 19.

in FIG. 19 and FIG. 20.

DETAILED DESCRIPTION OF THE INVENTION

Figure 1:
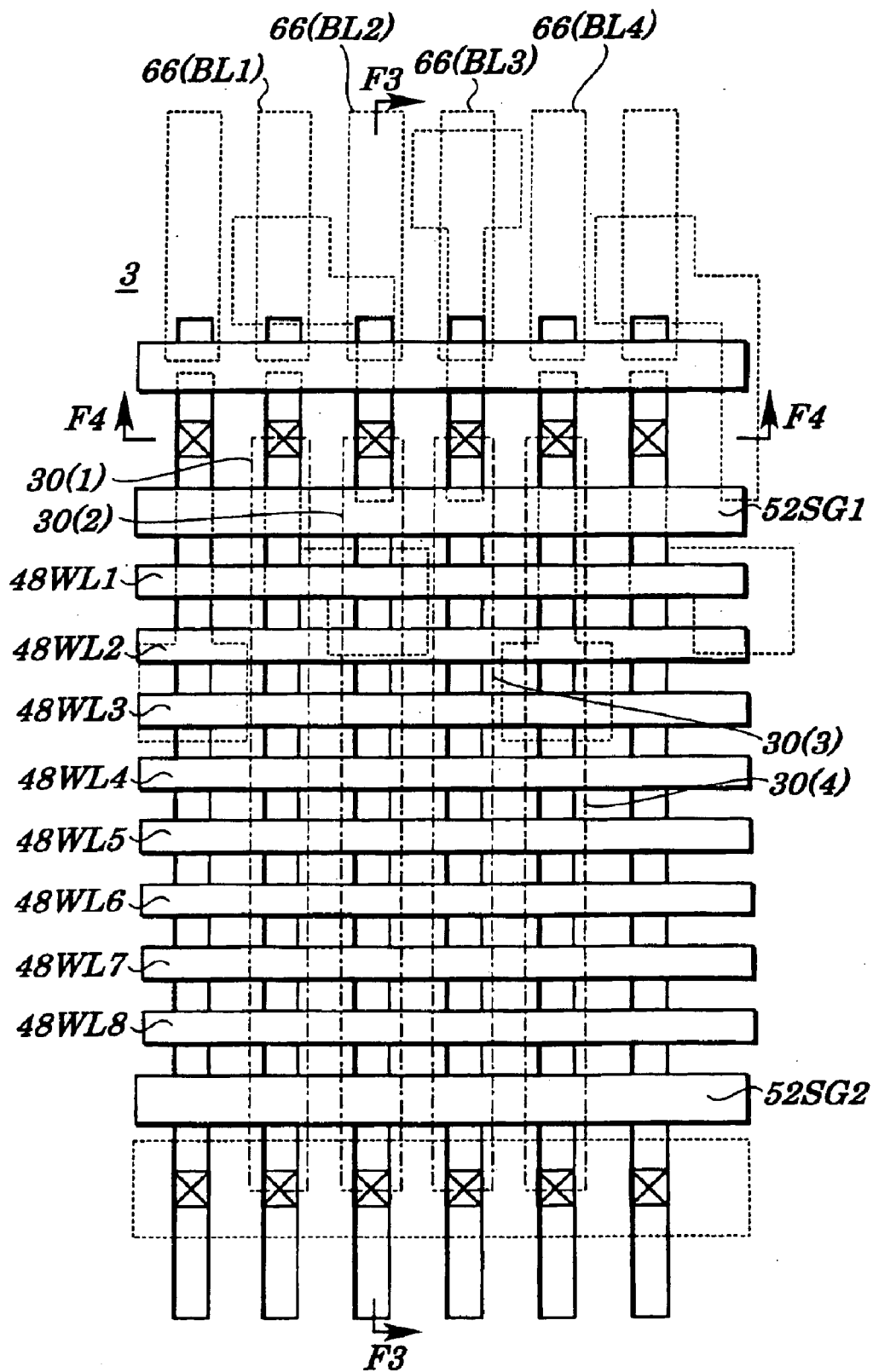
FIG. 1 is a plan view of an essential part of a memory cell array of a non-volatile memory in a semiconductor device according to a first embodiment of the invention.

The invention will be described hereinafter with reference to embodiments shown in the drawings. Like or corresponding parts are denoted by like or corresponding reference numerals. It should be noted that the drawings are schematic and that relationships between thickness and dimensional ratios of thickness of respective layers of components shown in the drawings sometimes differ from those of actual products. Further, different scales are sometimes employed in drawings.

First Embodiment of the Invention
[Configuration of Semiconductor Device Including NAND Type EEPROM]

Figure 6:
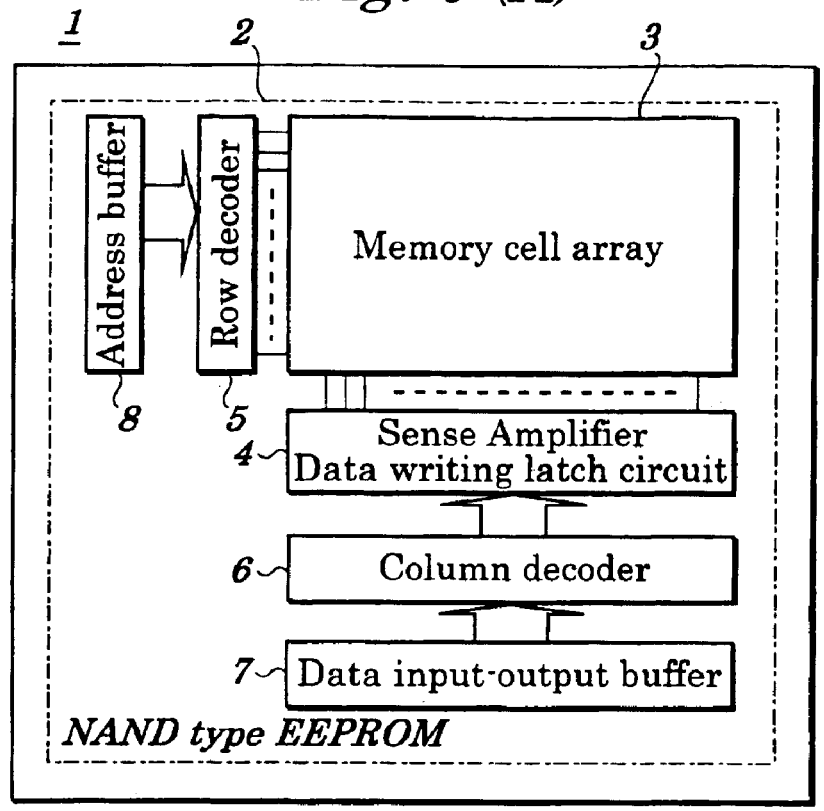
FIG. 6(A) shows a layout of the semiconductor device including the non-volatile memory of the first embodiment.
FIG. 6(B) is a block diagram of a semiconductor memory system including the non-volatile memory of the first embodiment.
Figure 6:
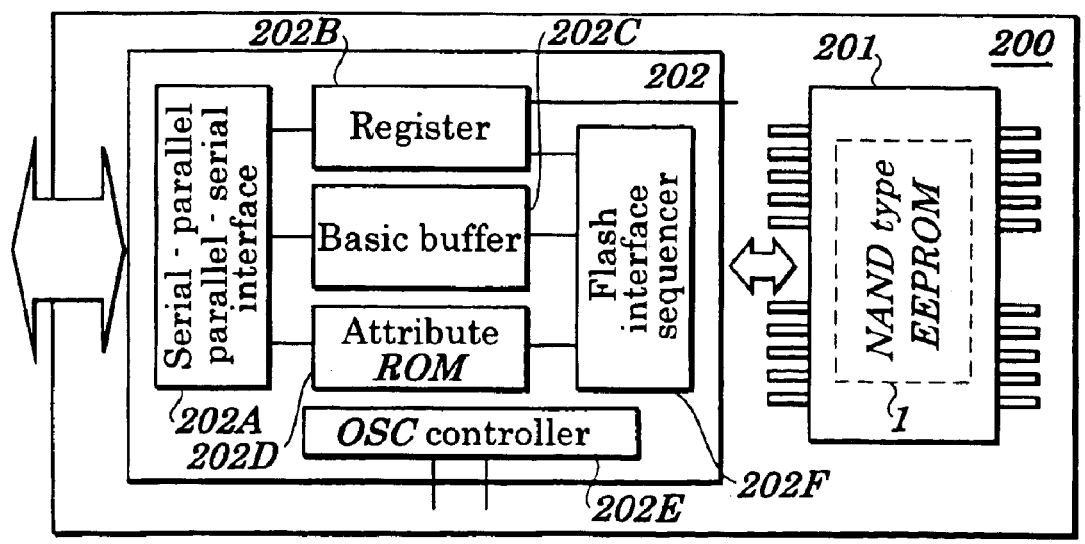
Figure 7:
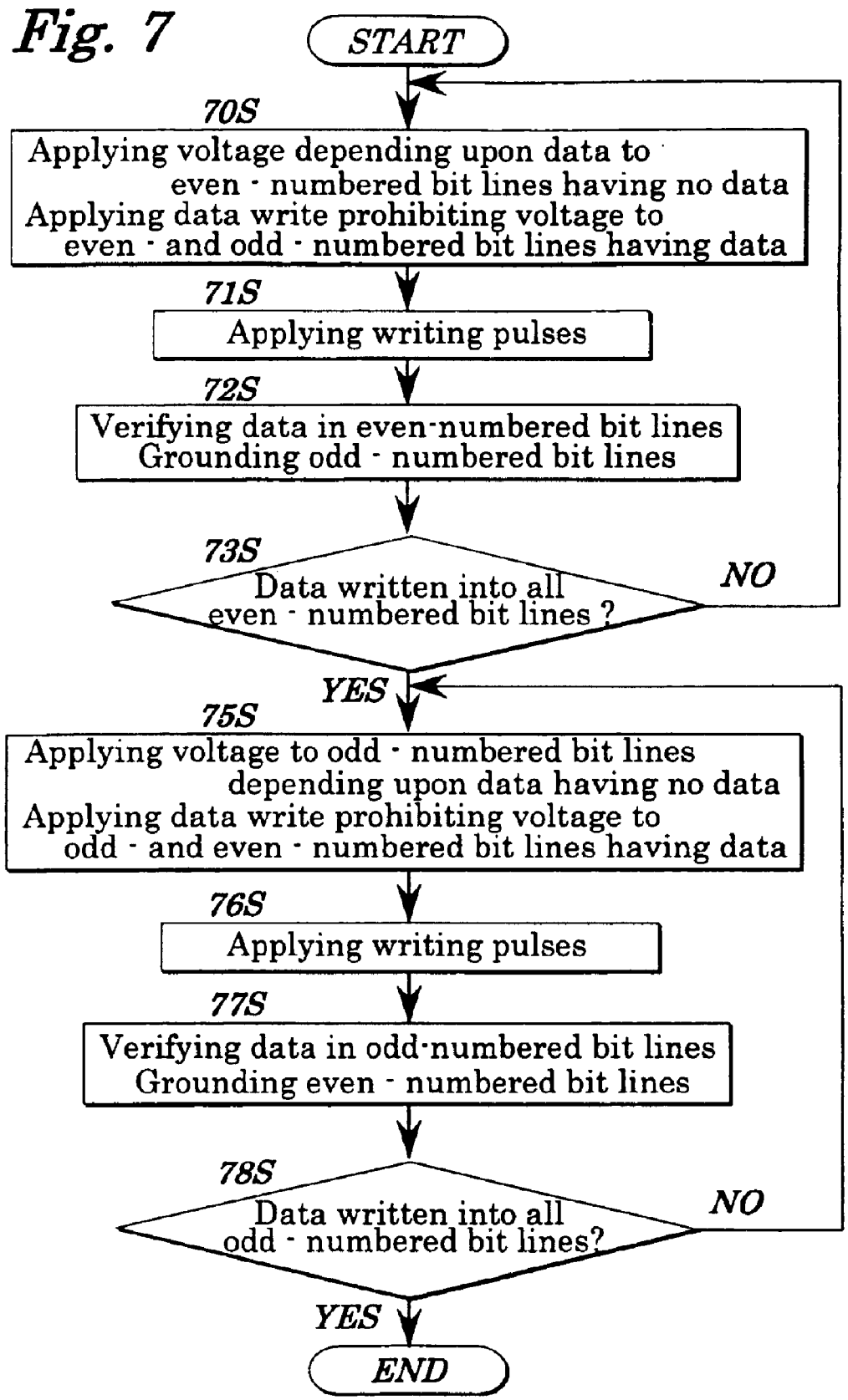
FIG. 7 is a flow chart showing the operation of the non-volatile memory of the first embodiment.

Referring to FIG. 6(A), a semiconductor device 1 comprises a NAND type EEPROM 2 as a non-volatile memory. The NAND type EEPROM 2 includes at least a memory cell array 3, a sense amplifier/data writing latch circuit 4 arranged along one side (i.e. at the lower side in these figures) of the memory cell array 3, a row decoder 5 arranged along the other side (i.e. at the right side of FIG. 6(A) of the memory cell array 3, a column decoder 6 connected to the sense amplifier/data writing latch circuit 4, a data input-output buffer 7 connected to the column decoder 6, and an address buffer 8 connected to the row decoder 5.

Alternatively, the semiconductor device 1 may comprise at least a NAND type EEPROM 2, which may be integrated on one semiconductor chip together with memories such as SRAM, DRAM and ROM, logic circuit, central processing unit (CPU) and so on.

[Circuit Configuration of Memory Cell Array of NAND Type EEPROM]

Figure 5:
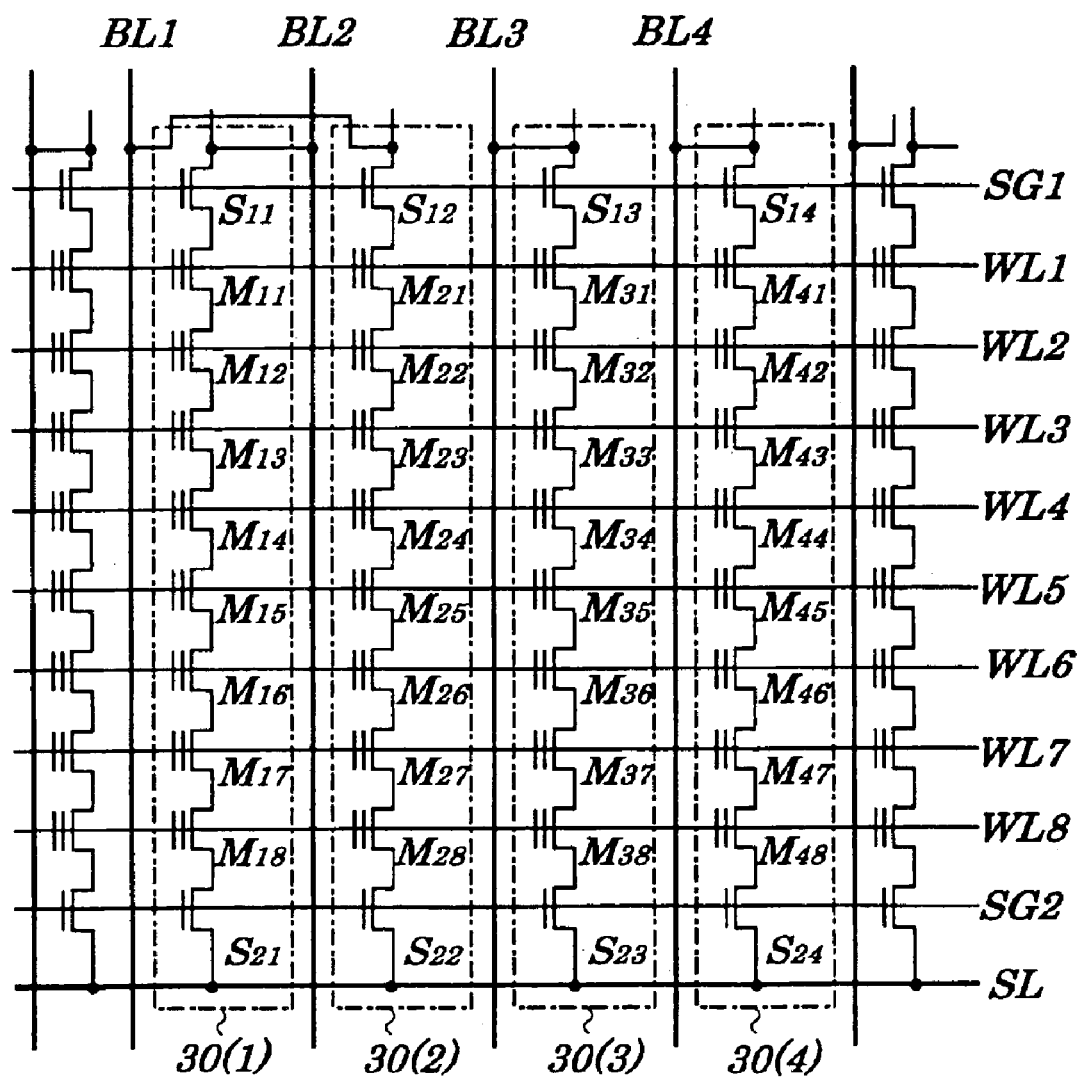
FIG. 5 is a circuit diagram of the memory cell array of the non-volatile memory of FIG. 1.

As shown in FIG. 5, the memory cell array 3 of the NAND type EEPROM 2 is composed of a plurality of memory cell units 30 which are arranged in a second direction (i.e. vertically or in rows in FIG. 5) and in a first direction (i.e. horizontally or in columns in FIG. 5) intersecting the first direction.

Each memory cell unit (or memory block) 30 includes a plurality of memory cells M (eight memory cells M, for example) which are adjacent in the second direction and are electrically connected in series. To be more specific, the memory cell unit 30(1) includes a total of eight memory cells $M_{11}$ to $M_{18}$ connected in series. The memory cell unit 30(2) is constituted by eight memory cells $M_{21}$ to $M_{28}$ connected in series. The memory cell unit 30(3) is constituted by eight memory cells $M_{31}$ to $M_{38}$ connected in series. The memory cell unit 30(4) is constituted by eight memory cells $M_{41}$ to $M_{48}$ connected in series.

Each memory cell M is realized by an n-type conductive insulated gate field effect transistor (IGFET) which includes a floating gate electrode (charge storing section) and a control gate electrode. The term IGFET refers at least to MOSFETs (metal oxide semiconductor field effect transistors), MISFETs (metal insulator semiconductor field effect transistors) or the like.

The NAND type EEPROM 2 includes: the memory cell $M_{11}$ (or $M_{12}$ to $M_{18}$), memory cell $M_{21}$ (or $M_{22}$ to $M_{28}$), memory cell $M_{31}$ (or $M_{32}$ to $M_{38}$) and memory cell $M_{41}$ (or $M_{42}$ to $M_{48}$), all of which are arranged in the first direction; bit line BL1 extending over the memory cell $M_{11}$ in the second direction and connected to the memory cell $M_{21}$; bit line BL2 extending over the memory cell $M_{21}$ in the second direction and connected to the memory cell $M_{11}$; bit line BL3 extending over the memory cell $M_{31}$ in the second direction and connected to the memory cell $M_{31}$; and bit line BL4 extending over the memory cell $M_{41}$ in the second direction and connected to the memory cell $M_{41}$.

Specifically, the memory cell unit 30(1) has an upper end thereof (shown in FIG. 5) connected to the bit line BL2 via a cell selecting transistor $S_{11}$, and has the lower end thereof connected to a source line SL via a cell selecting transistor $S_{21}$. The memory cell unit 30(2) has one end thereof connected to the bit line BL1 via a cell selecting transistor $S_{12}$, and has the lower end thereof connected to a source line SL via a cell selecting transistor $S_{22}$. In short, the bit line BL1 and the memory cell unit 30(2) are connected in a twisted state, and the bit line BL2 and the memory cell unit 30(1) are connected in a twisted state. Further, one end of the memory cell unit 30(3) is connected to the bit line BL3 via a cell selecting transistor $S_{13}$ while the other end thereof is connected to a source line SL via a cell selecting transistor $S_{23}$. One end of the memory cell unit 30(4) is connected to the bit line BL4 via a cell selecting transistor $S_{14}$ while the other end thereof is connected to a source line SL via a cell selecting transistor $S_{24}$. In other words, the bit line BL3 and memory cell unit 30(3) are connected in a straight state while the bit line BL4 and memory cell unit 30(4) are also connected in a straight state.

The bit line BL1 is arranged on the memory cell unit 30(1), i.e. on the memory cells $M_{11}$ to $M_{18}$, and extends in the second direction. The bit line BL2 is arranged on the memory cell unit 30(2), i.e. on the memory cells $M_{21}$ to $M_{28}$, and extends in the second direction. The bit line BL3 is arranged on the memory cell unit 30(3), i.e. on the memory cells $M_{31}$ to $M_{38}$, and extends in the second direction. The bit line BL4 is arranged on the memory cell unit 30(4), i.e. on the memory cells $M_{41}$ to $M_{48}$, and extends in the second direction.

A plurality of (eight for example) word lines WL are arranged in the second direction, are electrically connected to control gate electrodes of memory cells M arranged in the first direction, and extend over the memory cells M. Specifically, the word line WL1 is connected to and extends over the memory cells $M_{11}$ to $M_{41}$ of the memory cell units 30(1) to 30(4). The word lines WL2 to WL7 are connected in the similar manner. The word line WL8 is connected to and extends over the memory cells $M_{18}$ to $M_{48}$ of the memory cell units 30(1) to 30(4).

The cell selecting signal line SG1 is electrically connected to the gate electrodes of the cell selecting transistors $S_{11}$ to $S_{14}$. The cell selecting signal line SG2 is electrically connected to the gate electrodes of the cell selecting transistors $S_{21}$ to $S_{24}$. Not only the cell selecting signal lines SG1 and SG2 but also source lines SL extend in the first direction similarly to the word lines WL.

In the memory cell array 3, a pattern constituted by the four memory cell units 30(1) to 30(4) and four bit lines BL1 to BL4 is a basic (minimum) pattern unit to be repeated. Such a basic pattern unit is repeatedly arranged in the first direction, and is asymmetrically arranged around connecting parts of the bit lines BL and cell selecting transistors $S_{11}$ to $S_{14}$, and connecting parts of the source lines SL and cell selecting transistors $S_{21}$ to $S_{24}$, thereby forming the memory cell array 3.

[Structure of NAND Type EEPROM]

Figure 2:
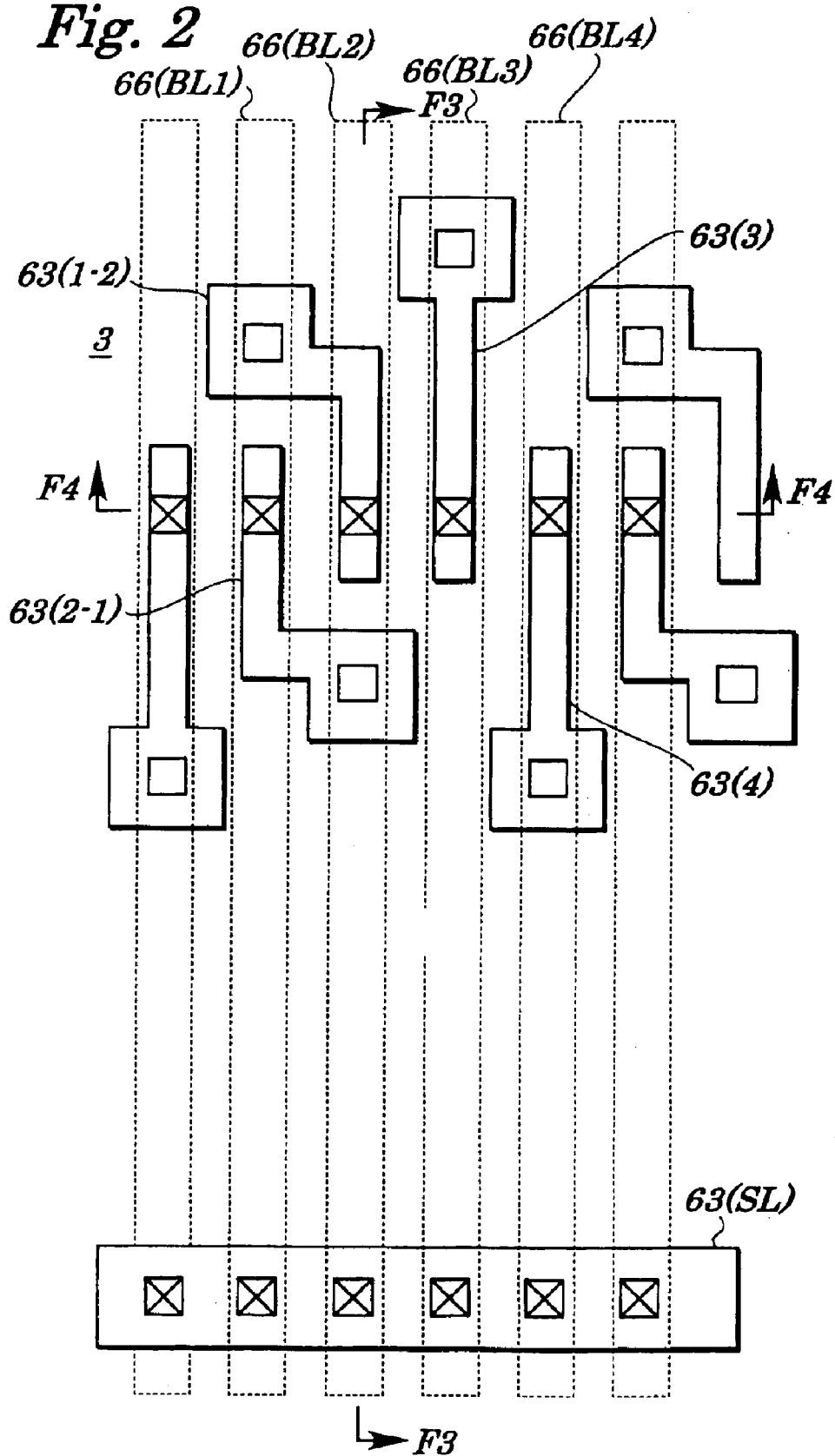
FIG. 2 is a plan view of a wiring layer of the memory cell array of FIG. 1.
Figure 3:
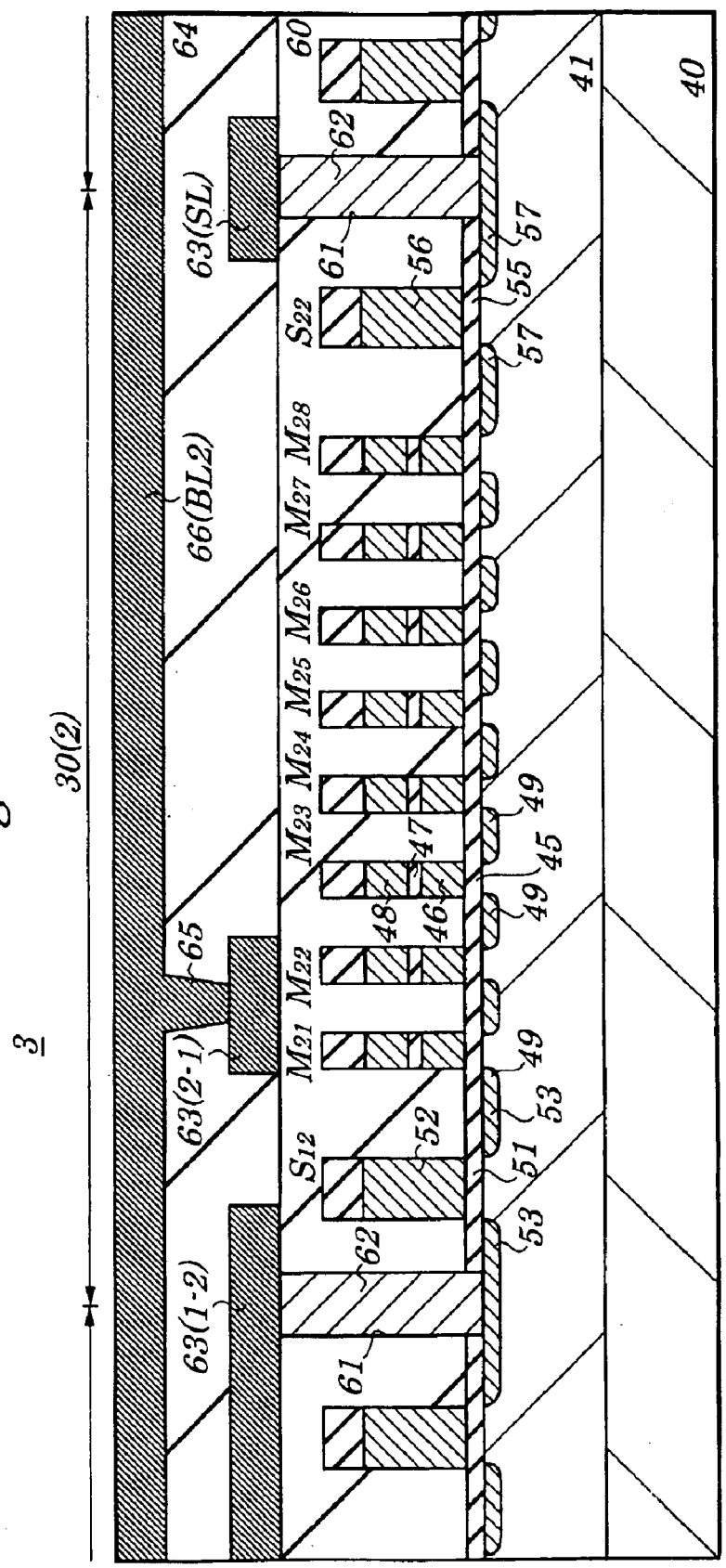
FIG. 3 is a cross section of an essential part of the semiconductor device, taken along line F3—F3 in FIG. 1 and FIG. 2.
Figure 4:
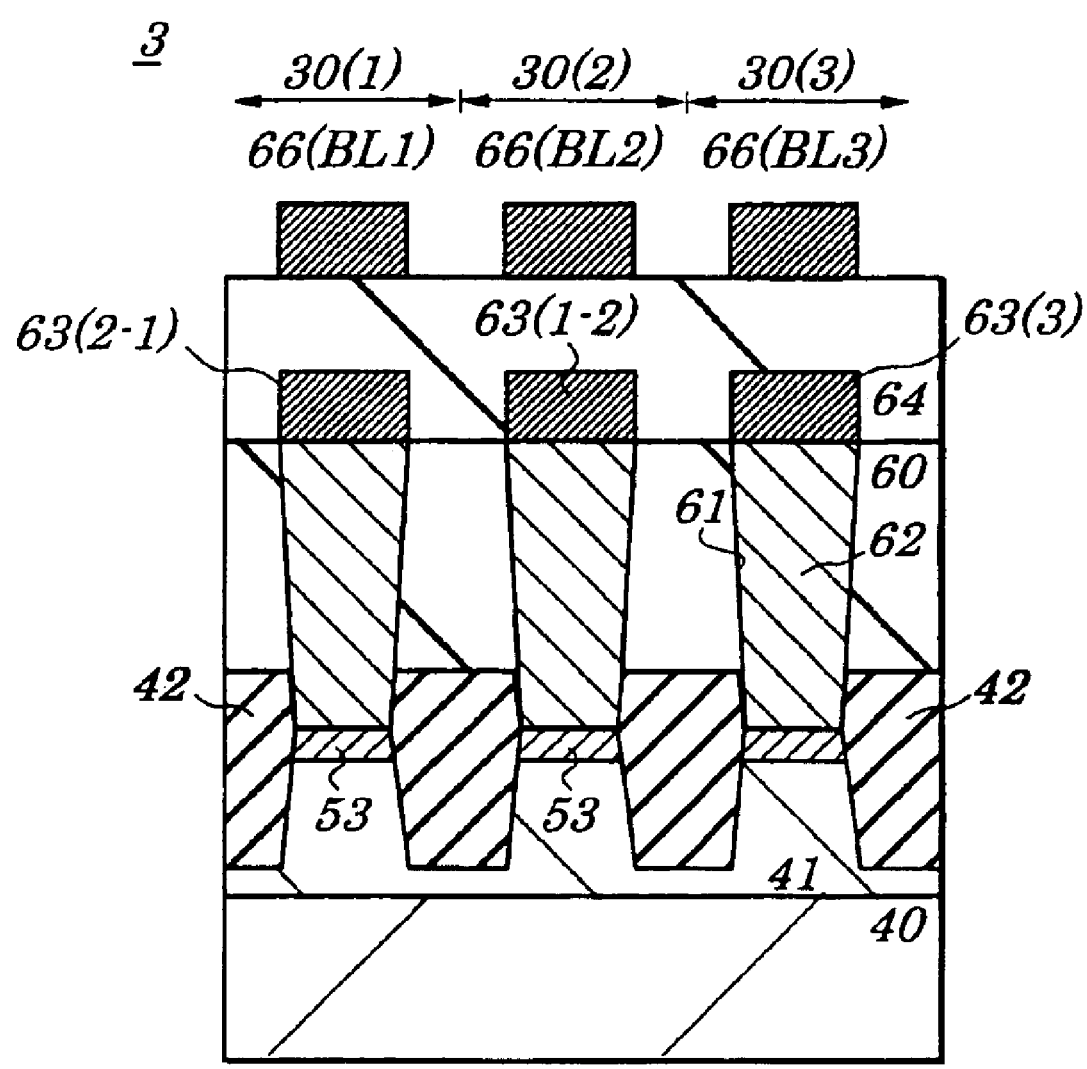
FIG. 4 is a cross section of an essential part of the semiconductor device, taken along line F4—F4 in FIG. 1 and FIG. 2.

The semiconductor device 1 comprising the NAND type EEPROM 2 is mounted on a main surface of a semiconductor substrate 40 (semiconductor chip) as shown in FIG. 1 to FIG. 4, particularly in FIG. 3 and FIG. 4. An n-type silicon single crystal substrate is used as the semiconductor substrate 40. The memory cell array 3 where a plurality of memory cells M are provided is positioned at a p-type well region 41 on the main surface of the semiconductor substrate 40. An element isolate insulating film 42 is provided around the memory cell M, i.e. a region for regulating gate width, and is made of a silicon oxide film, for example.

The memory cell M includes the well region 41, first gate insulating film 45, floating gate electrode (charge storing section) 46 on the first gate insulating film 45, second gate insulating film 47 on the floating gate electrode 46, control gate electrode 48 on the second gate insulating film 47, and a pair of n-type semiconductor regions 49 used as a source or drain region.

The first gate insulating film 45 is preferably made of a single layer of a silicon oxide film, oxy-nitrite film or the like or multiple layers of such films. The second gate insulating film 47 is preferably made of multiple layers of a silicon oxide film, a silicon nitrite film and a silicon oxide film, for example. The floating gate electrode 46 is preferably made of a silicon poly-crystal film, for example. Further, the control gate electrode 48 is preferably made of a single layer of a silicon poly-crystal film, a refractory metal silicide film or a refractory metal film, or multiple layers of the silicon poly-crystal film covered with the refractory metal silicide film or the refractory metal film.

In the memory cell unit 30, the semiconductor region 49, i.e. the source or drain region, of one memory cell M, is integral with the semiconductor region 49, i.e. source or drain region, of another memory cell M. These memory cells M are adjacent to each other in the second direction (i.e. vertically in FIG. 1 and FIG. 2, or horizontally in FIG. 3). Referring to FIG. 1 and FIG. 2, the control gate electrode 48 of one memory cell M is integral with a control gate electrode 48 of another memory cell M of another memory cell unit 30 adjacent in the first direction, thereby forming a word line 48WL extending in the column and row.

The cell selecting transistors $S_{11}$ to $S_{14}$ which are adjacent in the first direction include the well regions 41 (functioning as channel forming regions), gate insulating films 51 on the channel forming regions, gate electrodes 52 on the gate insulating films 51, and a pair of n-type semiconductor regions 53 used as source or drain regions. The gate electrodes 52 of the cell selecting transistors $S_{11}$ to $S_{14}$ are integral, thereby forming a cell selecting signal line 52SG1.

Further, the cell selecting transistors $S_{21}$ to $S_{24}$ which are adjacent in the first direction include the well regions 41 used as channel forming regions, gate insulating films 55 on the channel forming regions, gate electrodes 56 on the gate insulating films 55, and a pair of n-type semiconductor regions 57 functioning as source or drain regions. The gate electrodes 56 of the cell selecting transistors $S_{21}$ to $S_{24}$ are integral, thereby forming a cell selecting signal line 56SG2.

The bit lines 66 are formed as second wirings on an inter-level isolation film 64, and are connected to the semiconductor region 53 of the cell selecting transistor $S_1$ ($S_{11}$ to $S^{14}$) via a sub-bit line 63 provided as a first wiring on the inter-level isolation film 64. The bit lines 66 and sub-bit lines 63 are connected via connection holes in the inter-level isolation film 64. The sub-bit lines 63 and the semiconductor region 53 are connected via connection wirings (plugs) 62 embedded in connection holes 61 in the inter-level isolation film 60. The bit lines 66 and sub-bit lines 63 are preferably made of aluminum films, aluminum alloy films (Al—Si, Al—Cu, Al—Cu—Si and so on), copper films or the like.

Referring to FIG. 1 and FIG. 2, the sub-bit line 63(1-2) in the shape of an inverted L is used to connect the bit line 66 (BL1) and the memory cell unit 30 (2). The sub-bit line 63(1-2) extends on the memory cell unit 30(2) in the first direction and is folded in the second direction. The sub-bit line 63(2-1) in the shape of L is used to connect the bit line 66 (BL2) and the memory cell unit 30 (1). The sub-bit line 63(2-1) extends on the memory cell unit 30(1) in the first direction and is folded thereon in the second direction. The sub-bit line 63(3) in the shape of I is used to connect the bit line 66 (BL3) and the memory cell unit 30(3). The sub-bit line 63(3) extends on the memory cell unit 30(3) in the second direction. The sub-bit line 63(4) in the shape of I is used to connect the bit line 66 (BL4) and the memory cell unit 30(4). The sub-bit line 63(4) extends on the memory cell unit 30(4) in the second direction. The sub-bit line 63 electrically connect the bit line 66 and the semiconductor region 53 of the cell selecting transistor $S_1$, alleviate layout rules at connecting sections, and realize the twisted structure of connecting sections. Further, the sub-bit lines 63 are easily provided on the same wiring layer of the source lines 63SL, by simply modifying a mask pattern of the wiring layers. Alternatively, the bit lines 66 and sub-bit lines 63 may have different shapes.

The source lines 63SL are connected to the semiconductor regions 57 of the cell selecting transistor $S_2$ ($S_{21}$ to $S_{24}$) via the connection hole wiring 62 in the connection hole 61 of the inter-level isolation film 60.

The control gate electrodes 48 of the memory cells M in the memory cell units 30(1) to 30(4) adjacent in the first direction are integrated in order to form the word lines 48WL (48WL1 to 48WL8).

[Operation of NAND Type EEPROM]

The operation of the NAND type EEPROM 2 will be described with reference to FIG. 1 to FIG. 5 and FIG. 7.

(1) First of all, existing data are simultaneously erased in all of the memory cells M in a selected memory block. For this purpose, 0V is applied to the control gate electrodes 48 (word lines 48WL1 to 48WL8), and a high potential $V_{PPW}$, 20V for example, is applied to the well region 41. An FN tunnel current flows to the first gate insulating film 45, so that electrons are discharged from the floating gate electrode 46 to the well region 41. Therefore, threshold voltages of the memory cells M ($M_{11}$ to $M_{18}$, $M_{21}$ to $M_{28}$, $M_{31}$ to $M_{38}$, and $M_{41}$ to $M_{48}$) become negative.

(2) Next, data are written into the memory cells M connected to one word line 48WL (step 70S). Data writing is separately performed for the memory cells M (e.g. $M_{11}$ and $M_{41}$) connected to the even-numbered bit lines 66 (BL2 and BL4) and the memory cells M (e.g. $M_{21}$ and $M_{31}$) connected to the odd-numbered bit lines 66 (BL1 and BL3), thereby reducing interference caused by coupling noises generated between adjacent bit lines 66 and preventing erroneous data reading.

For instance, the data are simultaneously written into a plurality of memory cells M (e.g. $M_{11}$ and $M_{41}$) connected to the selected word line 48WL and to the even-numbered bit lines 66 (BL2 and BL4).

In order to write data "0" into the memory cells M, i.e. in order to make the threshold voltage positive, 0V is applied to the selected bit line 66. On the other hand, in order to write data "1" into the memory cells M, i.e. not to change the threshold voltage, the writing voltage $V_{CC}$, 3V for example, is applied to the selected bit line 66. The writing voltage $V_{CC}$ is applied to the odd-numbered bit lines 66 when writing the data into the memory cells M connected to the even-numbered bit lines 66. Further, the writing voltage $V_{CC}$ is applied to the cell selecting signal line 52SG1 connected to the cell selecting transistors $S_{11}$ and $S_{14}$ while the writing voltage $V_{PASS}$, 10V for example, is applied to the non-selected word lines WL. Still further, a high writing voltage $V_{PPW}$, 20V for example, is applied as pulses to the selected word line 48WL (step 71S).

In the memory cells M where data "0" is to be written, 0V is applied to the drain region (semiconductor region 49), channel forming region and source region (semiconductor region 49) while a high voltage is applied between the channel forming region and the control gate electrode 48. Therefore, the FN tunnel current flows to the first gate insulating film 45, and electrons are introduced into the floating gate electrode 46. In other words, the threshold voltage of the memory cells M is made positive.

Further, in the memory cells M where data "1" is to be written, the cell selecting transistors $S_{11}$ and $S_{14}$ are cut off. The potential of the channel forming region is raised because of the coupling capacitance caused by the potential $V_{PASS}$ applied to the non-selected control gate electrode 48, thereby alleviating an electric field generated between the channel forming region and the control gate electrode 48. Since no electrons are introduced into the floating gate electrode 46 from the channel forming region, the threshold voltage of the memory cells M remains unchanged.

The threshold voltage of the memory cells M connected to the odd-numbered bit lines 66 (BL1 and BL3) remains unchanged while the data are being written into the memory cells M connected to the even-numbered bit lines 66 (BL2 and BL4).

(3) It is verified whether or not the threshold voltage reaches the specified value in the memory cells M where data "0" has been written after application of the high data writing voltage $V_{PPW}$ to the selected word lines 48WL (step 72S). For this purpose, the reading voltage $V_{CC}$, 3V for example, is applied to the even-numbered bit lines 66, 0V is applied to the odd-numbered bit lines 66 and to the control gate electrodes (word lines 48WL) connected to the selected memory cells M, and the reading voltage $V_{CC}$ is applied to the other word lines 48WL and cell selecting signal line 52SG1. In this state, it is checked whether or not a current flows from the bit lines 66 via the memory cells M. If the current flows, the threshold voltage does not become high enough in the selected memory cells M, i.e. the data writing is not completed. Therefore, the data writing is repeated.

Conversely, if no current flows, the data writing has been completed. The 0V potential of the bit lines 66 is changed to the potential $V_{CC}$, so that further data writing is prohibited, which prevents the threshold voltage from varying in the memory cells M.

Thereafter, the data writing is repeated for all of the memory cells M connected to the selected word line 48WL and to the even-numbered bit lines 66 (step 73S).

(4) The data are written as described above into the memory cells M connected to the odd-numbered bit lines 66 (steps 75S and 76S).

(5) The data written into the memory cells M connected to the odd-numbered bit lines 66 are verified as described above (step 77S). Verification of the written data is repeated until the data are written into all of the memory cells M (step 78S).

(6) The written data are read in the manner similar to the verification. The reading voltage $V_{CC}$, 3V for example, is applied to the bit lines 66, and 0V is applied to the control gate electrodes 48 (word lines 48WL) connected to the selected memory cells M. Further, the reading voltage $V_{CC}$ is applied to the non-selected word lines 48WL and the cell selecting signal line 52SG1. In this state, it is checked whether or not a current flows from the bit lines 66 via the memory cells M. Similarly to the data writing, data reading is separately performed for the memory cells M (e.g. $M_{11}$ and $M_{41}$) connected to the even-numbered bit lines 66 (BL2 and BL4) and the memory cells M (e.g. $M_{21}$ and $M_{31}$) connected to the odd-numbered bit lines 66 (BL1 and BL3). When reading the data from the memory cells M connected to the even-numbered bit lines 66, 0V is applied to the odd-numbered bit lines 66. On the other hand, in order to read the data from the memory cells M connected to the odd-numbered bit lines 66, 0V is applied to the even-numbered bit lines 66.

In the first embodiment, the odd-numbered bit line 66 (BL1) is connected to the memory cells $M_{21}$ to $M_{28}$ of the memory cell unit 30(2), and the odd-numbered bit line 66 (BL3) is connected to the memory cells $M_{31}$ to $M_{38}$ of the memory cell unit 30(3). Therefore, the verification and the data reading are simultaneously performed for the memory cells $M_{21}$ to $M_{28}$ and the memory cells $M_{31}$ to $M_{38}$. The even-numbered bit line 66 (BL2) is connected to the memory cells $M_{11}$ to $M_{18}$ of the memory cell unit 30(1), and the even-numbered bit line 66 (BL4) is connected to the memory cells $M_{41}$ to $M_{48}$ of the memory cell unit 30(4). The verification and the data reading are simultaneously performed for the memory cells $M_{11}$ to $M_{18}$ and the memory cells $M_{41}$ to $M_{48}$. It is possible to reduce variations of the threshold voltage due to coupling noises between floating gate electrodes 46 of adjacent memory cells M.

Figure 24:
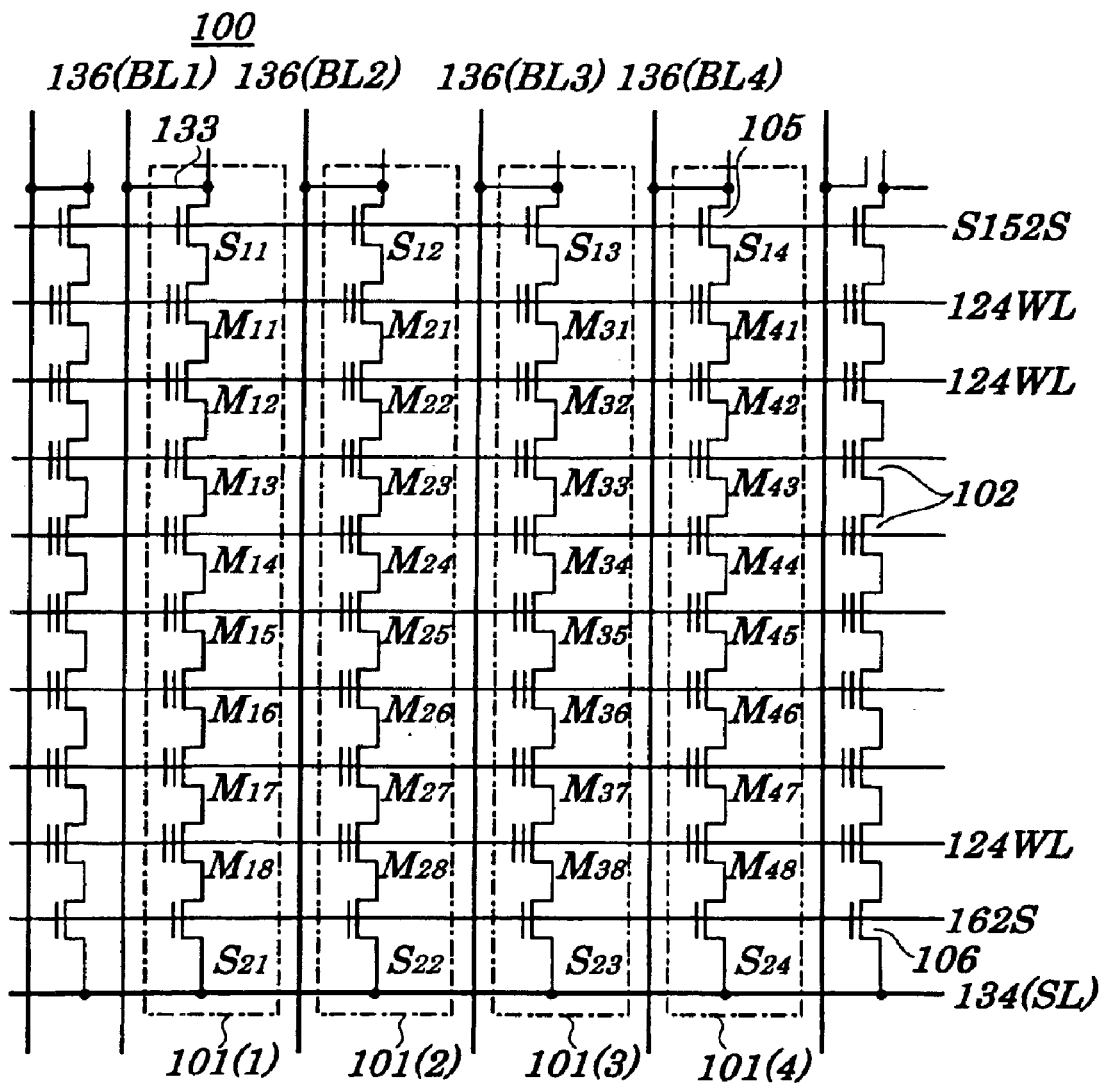
FIG. 24 is a circuit diagram of a memory cell array of the semiconductor device shown in FIG. 19 to FIG. 23.
Figure 25:
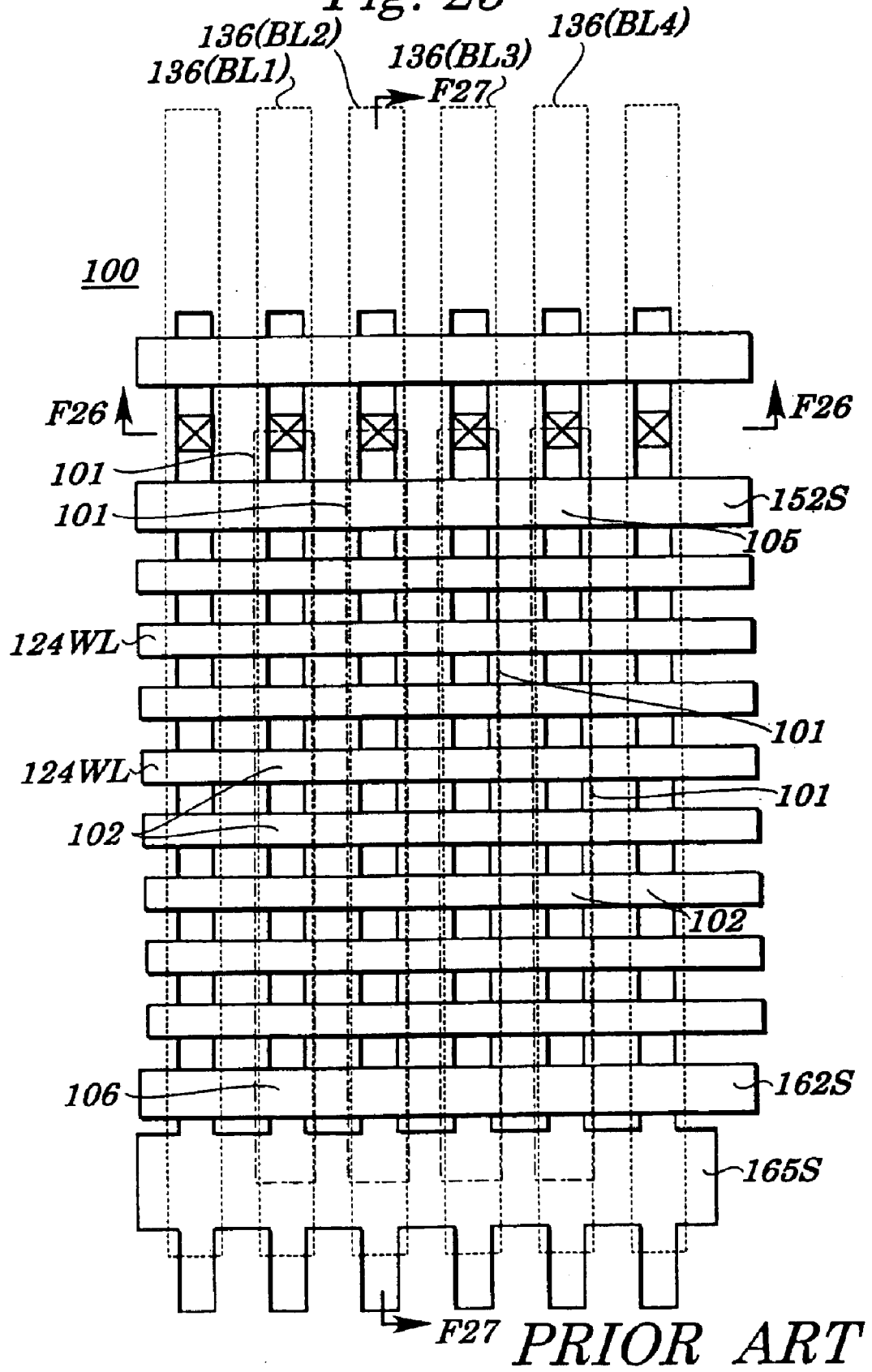
FIG. 25 is a plan view of an essential part of a memory cell array in an another semiconductor device of the related art.
Figure 26:
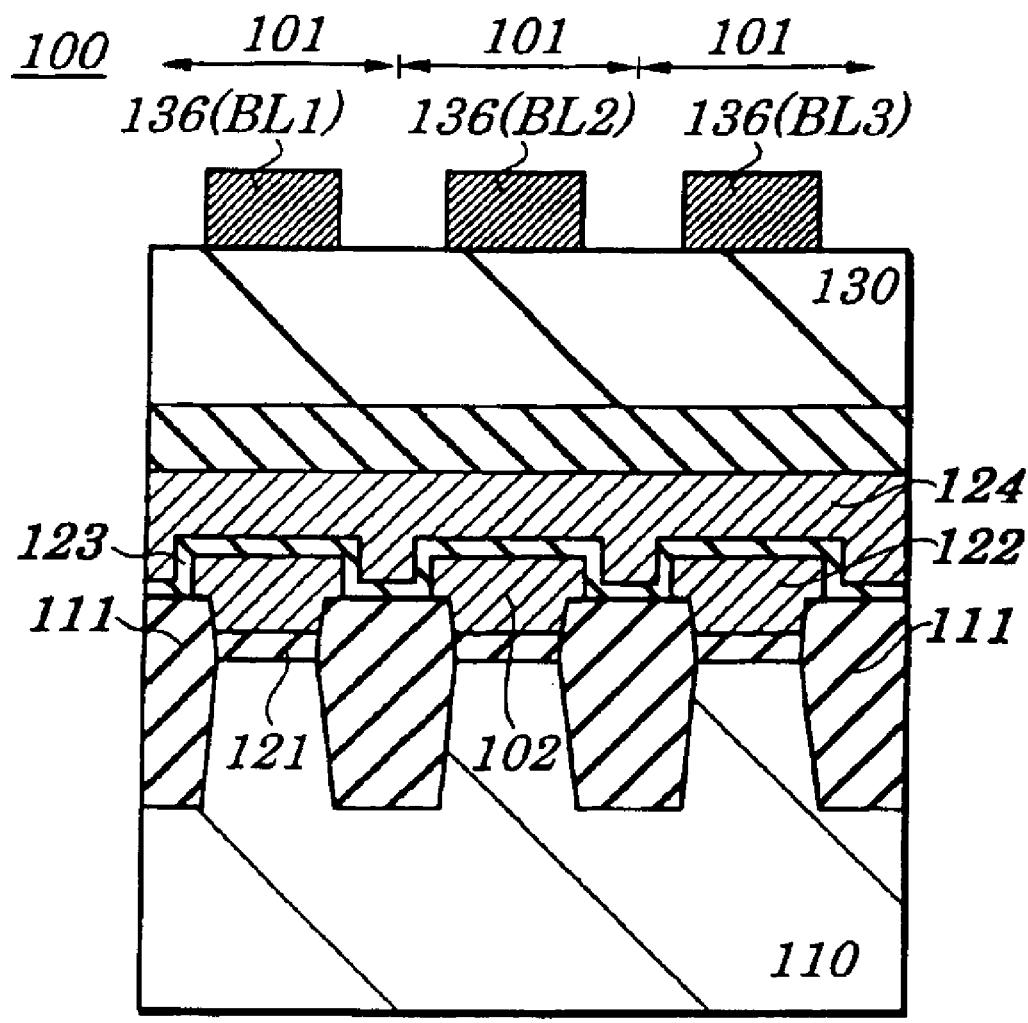
FIG. 26 is a cross section of the second semiconductor device, taken along line F26—F26 in FIG. 25.
Figure 27:
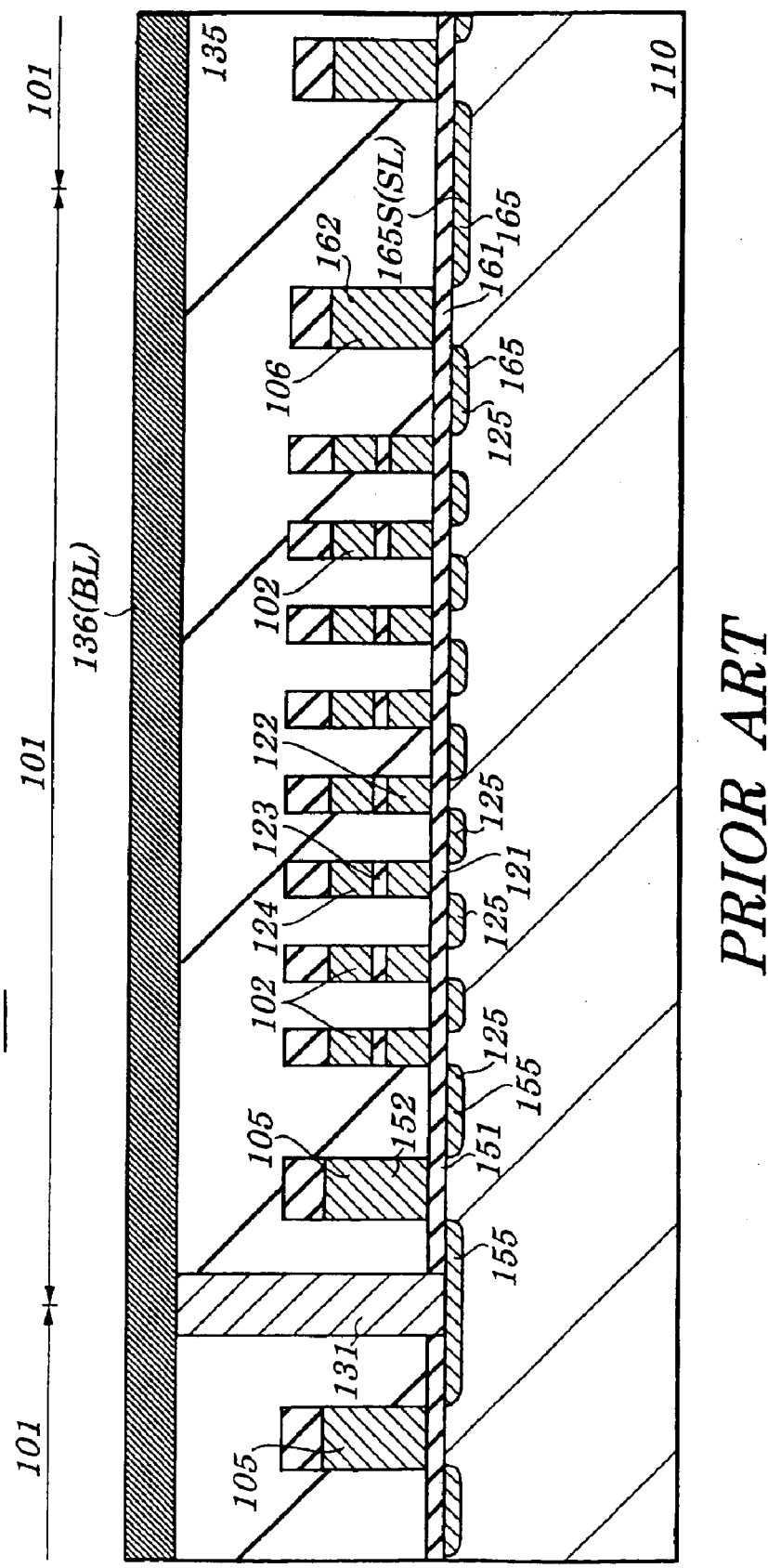
FIG. 27 is a cross section of the semiconductor device, taken along line F27—F27 in FIG. 25.
Figure 28:
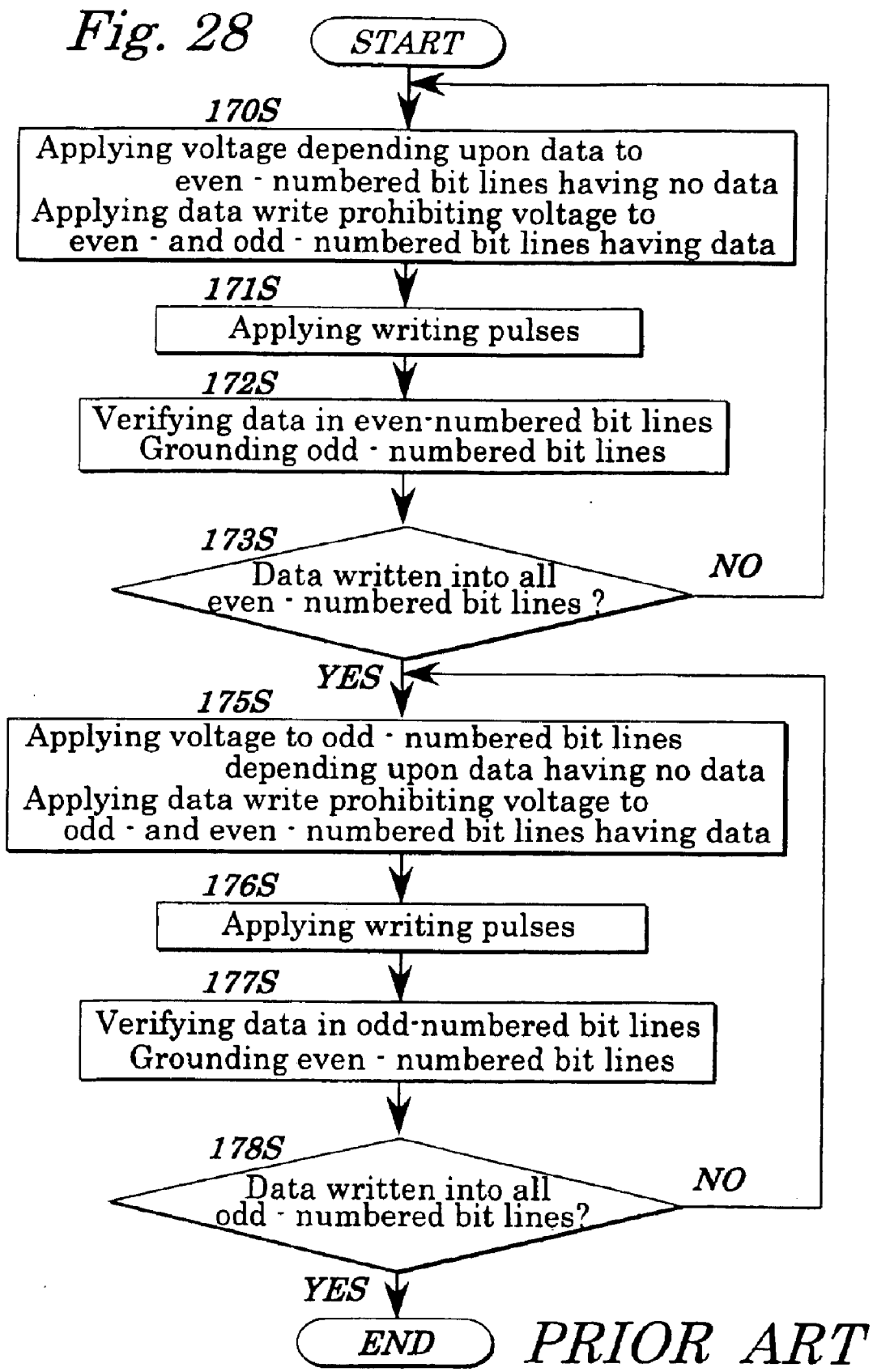
FIG. 28 is a flow chart showing the operation of one of semiconductor devices of the related art.
Figure 29:
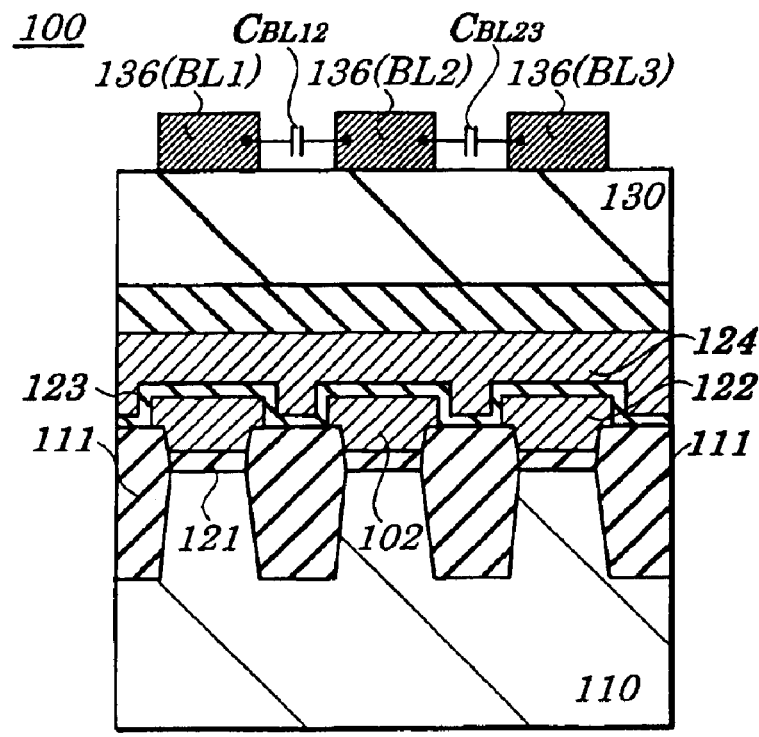
FIG. 29 is a cross section of an essential part of the semiconductor device of the related art, for describing problems thereof.
Figure 30:
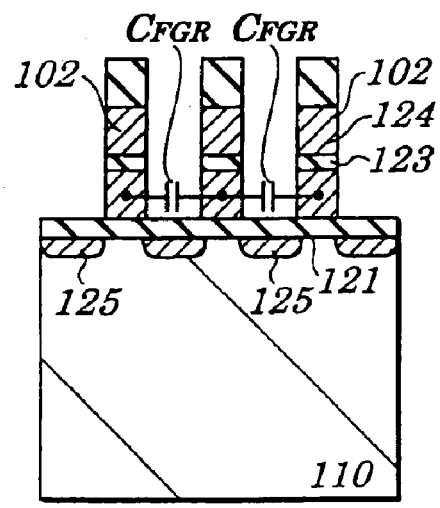
FIG. 30 is a cross section of the semiconductor device of the related art, for describing problems thereof.
Figure 31:
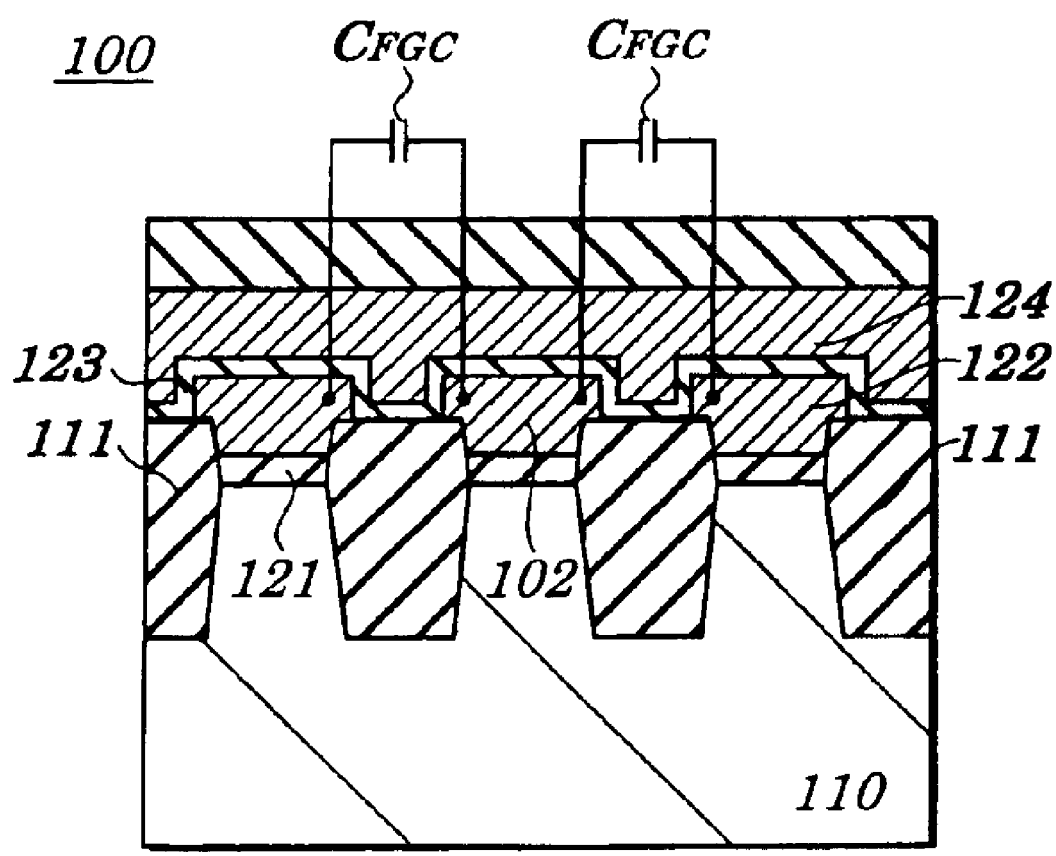
FIG. 31 is a cross section of one of semiconductor devices of the related art, for describing problems thereof.

In the NAND type EEPROM of the related art shown in FIG. 24, the threshold voltage varies with an amount of charge stored in the floating gate electrode (charge storing section) 122 of another memory cell 102, which is adjacent to the particular memory cell 102, during the verification or the data reading. In other words, when the data are written into memory cells 102 connected to every two bit lines 136, these memory cells 102 are affected by adjacent memory cells 102 which are positioned at opposite sides of the element isolation region 111. To be more specific, when writing the data into the even-numbered memory cell 102 ($M_{22}$) at first, the data are also written into the second and fourth memory cell units 101. As a result, the memory cell ($M_{22}$) is affected by the memory cells $M_{12}$ and $M_{32}$ where the data are to be written later. Further, the memory cell ($M_{22}$) is affected by the memory cells $M_{11}$, $M_{13}$, $M_{31}$ and $M_{33}$ which are diagonally adjacent.

With the semiconductor device 1 of the first embodiment, the data are simultaneously written not only into the memory cell $M_{22}$ but also into the memory cells M of the second and third memory cell units 30(2) and 30(3) connected to the odd-numbered bit lines 66 (BL1 and BL3), i.e. the data are written into the memory cell $M_{22}$ and the memory cell $M_{32}$ adjacent thereto. Therefore, during the verification and the data reading, the memory cell $M_{22}$ is not influenced by the memory cell $M_{32}$, but is influenced only by the memory cell $M_{12}$. The memory cells $M_{22}$ and $M_{32}$ are at the opposite sides of the memory cell $M_{22}$ in the first direction. As a result, the memory cell $M_{22}$ is protected against influence of coupling noises and variations of the threshold voltage. Further, it is possible to reduce erroneous data reading in the NAND type EEPROM 2.

In the first embodiment, the verification may be performed only for the memory cells M connected to the even-numbered bit lines 66 (BL2 and BL4) or the odd-numbered bit lines (BL1 and BL3). Alternatively, the verification may be performed alternately for the memory cells M connected to the even-numbered and odd-numbered bit lines 66, or may be performed in any order.

[Configuration of Semiconductor Memory System]

The foregoing semiconductor device 1 including the NAND type EEPROM (non-volatile memory) 2 can constitute a semiconductor memory system.

Referring to FIG. 6(B), the semiconductor memory system 200 comprises at least a semiconductor package 201 in which a NAND type EEPROM 2 is sealed, and a controller 202. The NAND type EEPROM 2 is preferably a flash NAND type EEPROM. The semiconductor package 201 is preferably a reliable but expensive ceramics package, or inexpensive resin package. A plurality of leads (without reference numbers) are provided around the semiconductor package 201 in order to supply power source voltages, to input control signals for data reading and writing, and to input and output data, and so on.

The controller 202 is constituted by a serial-parallel/parallel-serial interface 202A, a register 202B, a basic buffer 202C, an attribute ROM 202D, an OSC controller 202E, and a flash interface sequencer 202F. The controller 202 receives a power source voltage from an external unit of the semiconductor memory system 200, transmits and receives control signals for the data writing and reading, and inputs and outputs data.

Alternatively, the semiconductor memory system 200 may be a circuit board (e.g. a mother board, a daughter board or a baby board, memory board, logic board or the like) to be incorporated in a personal computer, an electronic device and so on, or an IC card.

Second Embodiment of the Invention

A second embodiment of the invention somewhat differs from the first embodiment with respect to the data writing.
[Structure of Semiconductor Device]

A semiconductor device 1 of the second embodiment is identical to the semiconductor device 1 of the first embodiment, but is provided with a power generating circuit for obtaining an intermediate voltage Vm, not shown. The power generating circuit is not always provided in the semiconductor device 1. The intermediate voltage Vm may be supplied from an external power generating circuit.
[Operation of the NAND Type EEPROM]

The operation of the NAND type EEPROM 2 will be described with reference to FIG. 1 to 5 and FIG. 7.
(1) First of all, existing data are erased in the memory cell arrays 3 in the NAND type EEPROM 2, similarly to the first embodiment.
(2) Next, data are written into the memory cells M connected to one word line 48WL (step 70S). The data writing is separately performed for the memory cells M (e.g. $M_{11}$ and $M_{41}$) connected to the even-numbered bit lines 66 (BL2 and BL4) and the memory cells M (e.g. $M_{21}$ and $M_{31}$) connected to the odd-numbered bit lines 66 (BL1 and BL3), for the reasons mentioned in the first embodiment.

For instance, the data are simultaneously written into a plurality of memory cells M (e.g. $M_{11}$, and $M_{14}$) connected to the word line 48WL and to the even-numbered bit lines 66 (BL2 and BL4).

In order to write data "0" into the memory cells M, i.e. to make the threshold voltage thereof positive, 0V is applied to the selected bit lines 66. On the other hand, in order to write data "1" into the memory cells M, i.e. not to change the threshold voltage, the intermediate voltage Vm, 8V for example, is applied to the selected bit lines 66. The intermediate voltage Vm is supplied by the built-in or external power generating circuit.

The intermediate voltage Vm is applied to the odd-numbered bit lines 66 when writing the data into the memory cells M connected to the even-numbered bit lines 66. Further, the intermediate voltage Vm is applied to the cell selecting signal line 52SG1 connected to the cell selecting transistors $S_{11}$ and $S_{14}$ while the intermediate voltage Vm is applied to the non-selected word lines 48WL. Still further, the high data writing voltage $V_{PPW}$, 20V for example, is applied as pulses to the selected word lines 48WL (step 71S).

In the memory cells M where data "0" is to be written, 0V is applied to the drain region (semiconductor region 49), channel forming region and source region (semiconductor region 49) while a high voltage is applied between the channel forming region and the control gate electrode 48. Therefore, the FN tunnel current flows to the first gate insulating film 45, and electrons are introduced into the floating gate electrode 46. As a result, the threshold voltage of the memory cells M is made positive.

Further, in the memory cells M where data "1" is to be written, the intermediate voltage Vm is applied to the drain region (semiconductor region 49), channel forming region, and source region (semiconductor region 49). A potential difference between the channel forming region and the control gate electrode 48 is small compared with that of the memory cells M where data "0" is to be written, so that electrons are prevented from being introduced into the floating gate electrode 46 from the channel forming region. As a result, the threshold voltage of the memory cells M remain unchanged.

The threshold voltage of the memory cells M connected to the odd-numbered bit lines 66 (BL1 and BL3) remains unchanged while the data are being written into the memory cells M connected to the even-numbered bit lines 66 (BL2 and BL4).
(3) Further, the data are written into the memory cells M connected to the odd-numbered bit lines in the similar manner.
(4) Verification is performed (step 72S) as described with respect to the first embodiment, and is repeated until the data writing is completed.
(5) The written data are read as described with respect to the first embodiment.

The second embodiment is essentially identical to the first embodiment, but differs therefrom in the application of the intermediate voltage Vm during the data writing. The second embodiment is as effective as the first embodiment.

Third Embodiment of the Invention

In a third embodiment of the invention, a semiconductor device 1 comprises an AND type EEPROM as a large capacity memory.
[Circuit Configuration of Memory Cell Array of AND Type EEPROM]

Figure 8:
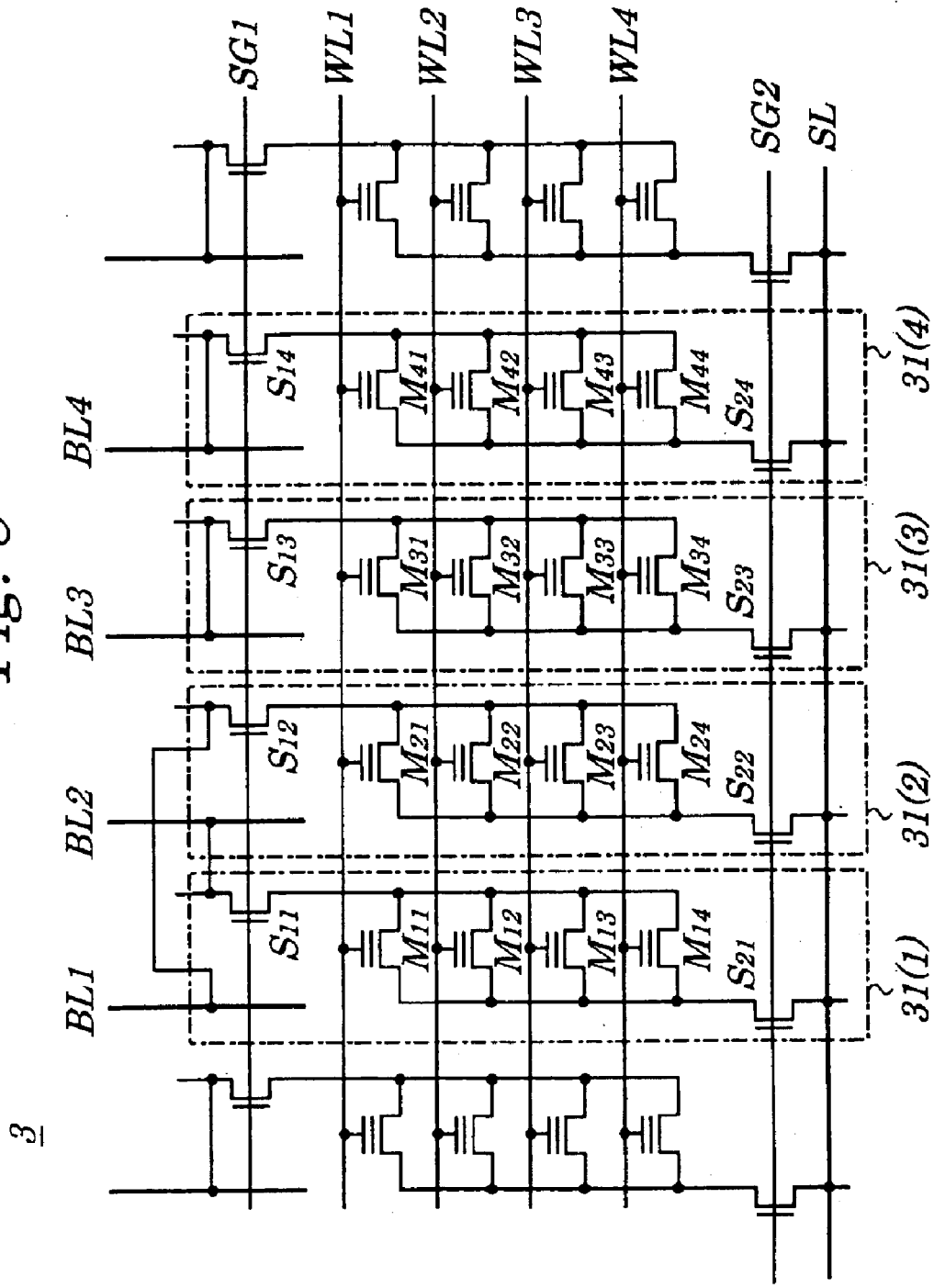
FIG. 8 is a circuit diagram of a memory cell array of a non-volatile memory in a semiconductor device according to a third embodiment of the invention.

The AND type EEPROM is configured as shown in FIG. 8. A memory cell array 3 of the AND type EEPROM includes a plurality of memory cell units 31 arranged in the first and second directions.

Each memory cell unit 31 is constituted by a plurality of memory cells M, e.g. four memory cells M which are adjacent to one another in the second direction and are electrically connected in parallel. To be more specific, the memory cell unit 31(1) includes a total of four memory cells $M_{11}$ to $M_{14}$. The memory cell unit 31(2) includes a total of four memory cells $M_{21}$ to $M_{24}$. The memory cell unit 31(3) includes a total of four memory cells $M_{31}$ to $M_{34}$. The memory cell unit 31(4) includes a total of four memory cells $M_{41}$ to $M_{44}$.

Each memory cell M is made of one n-channel conductive IGFET having a floating gate electrode (charge storing section) and a control gate electrode, similarly to the memory cell M of the NAND type EEPROM 2 in the first embodiment.

The AND type EEPROM 2 comprises: the memory cells $M_{11}$ (or $M_{12}$ to $M_{14}$), $M_{21}$ (or $M_{22}$ to $M_{24}$), $M_{31}$ (or $M_{32}$ to $M_{34}$), and $M_{41}$ (or $M_{42}$ to $M_{44}$), all of which are arranged in the first direction; a bit line BL1 extending over the memory cell $M_{11}$ in the second direction and connected to the memory cell $M_{21}$; a bit line BL2 extending over the memory cell $M_{21}$ in the second direction and connected to the memory cell $M_{11}$; a bit line BL3 extending over the memory cell $M_{31}$ in the second direction and connected to the memory cell $M_{31}$; and a bit line BL4 extending over the memory cell $M_{41}$ in the second direction and connected to the memory cell $M_{41}$.

The memory cell unit 31(1) has one end thereof connected to the bit line BL2 via the cell selecting transistor $S_{11}$ and the other end thereof connected to a source line SL via the cell selecting transistor $S_{21}$. The memory cell unit 31(2) has one end thereof connected to the bit line BL1 via the cell selecting transistor $S_{12}$ and the other end thereof connected to a source line SL via the cell selecting transistor $S_{22}$. In other words, the bit line BL1 and the memory cell unit 31(2) are connected in a twisted state, and the bit line BL2 and the memory cell unit 31(1) are also connected in a twisted state. On the other hand, the memory cell unit 31(3) has one end thereof connected to the bit line BL3 via the cell selecting transistor $S_{13}$, and the other end thereof connected to a source line SL via the cell selecting transistor $S_{23}$. The memory cell unit 31(4) has one end thereof connected to the bit line BL4 via the cell selecting transistor $S_{14}$, and the other end thereof connected to a source line SL via the cell selecting transistor $S_{24}$. In short, the bit line BL3 and memory cell unit 31(3) and the bit line BL4 and memory cell unit 31(4) are connected to one another in a straight state.

The bit line BL1 is provided on the memory cell unit 31(1) and extends in the second direction. The bit line BL2 is provided on the memory cell unit 31(2) and extends in the second direction. The bit line BL3 is provided on the memory cell unit 31(3) and extends in the second direction. The bit line BL4 is provided on the memory cell unit 31(4) and extends in the second direction.

A plurality of word lines WL, e.g. four word lines, are electrically connected to the control gate electrodes of the memory cells M arranged in the first direction, and extend over the memory cells M in the second direction.

The cell selecting signal line SG1 is electrically connected to the cell selecting transistors $S_{11}$ to $S_{14}$. The cell selecting signal line SG2 is electrically connected to the cell selecting transistors $S_{21}$ to $S_{24}$. Not only the cell selecting signal lines SG1 and SG2 but also the source lines SL extend in the fist direction similarly to the word lines WL.

In the memory cell array 3, a pattern constituted by the four memory cell units 31 (1) to 31 (4) and four bit lines BL1 to BL4 is a basic (minimum) pattern unit. Such a basic pattern unit is repeatedly arranged in the first direction, and the basic pattern unit is axisymmetrically arranged around connecting parts of the bit lines BL and cell selecting transistors $S_{11}$ to $S_{14}$ or connecting parts of the source lines SL and cell selecting transistors $S_{21}$ to $S_{24}$, thereby forming the memory cell array 3.

The operation of the AND type EEPROM of this embodiment is identical to that of the NAND type EEPROM 2 of the first embodiment, and will not be described here.

The semiconductor device 1 of the third embodiment is as effective and advantageous as the semiconductor device 1 of the first embodiment.

Fourth Embodiment of the Invention

This embodiment relates to a semiconductor device 1 comprising a 3-transistor NAND type EEPROM in order to rewrite data per byte or per page and to accelerate and facilitate the data reading.

[Circuit Configuration of Memory Cell Array of 3-transistor NAND Type EEPROM]

Figure 9:
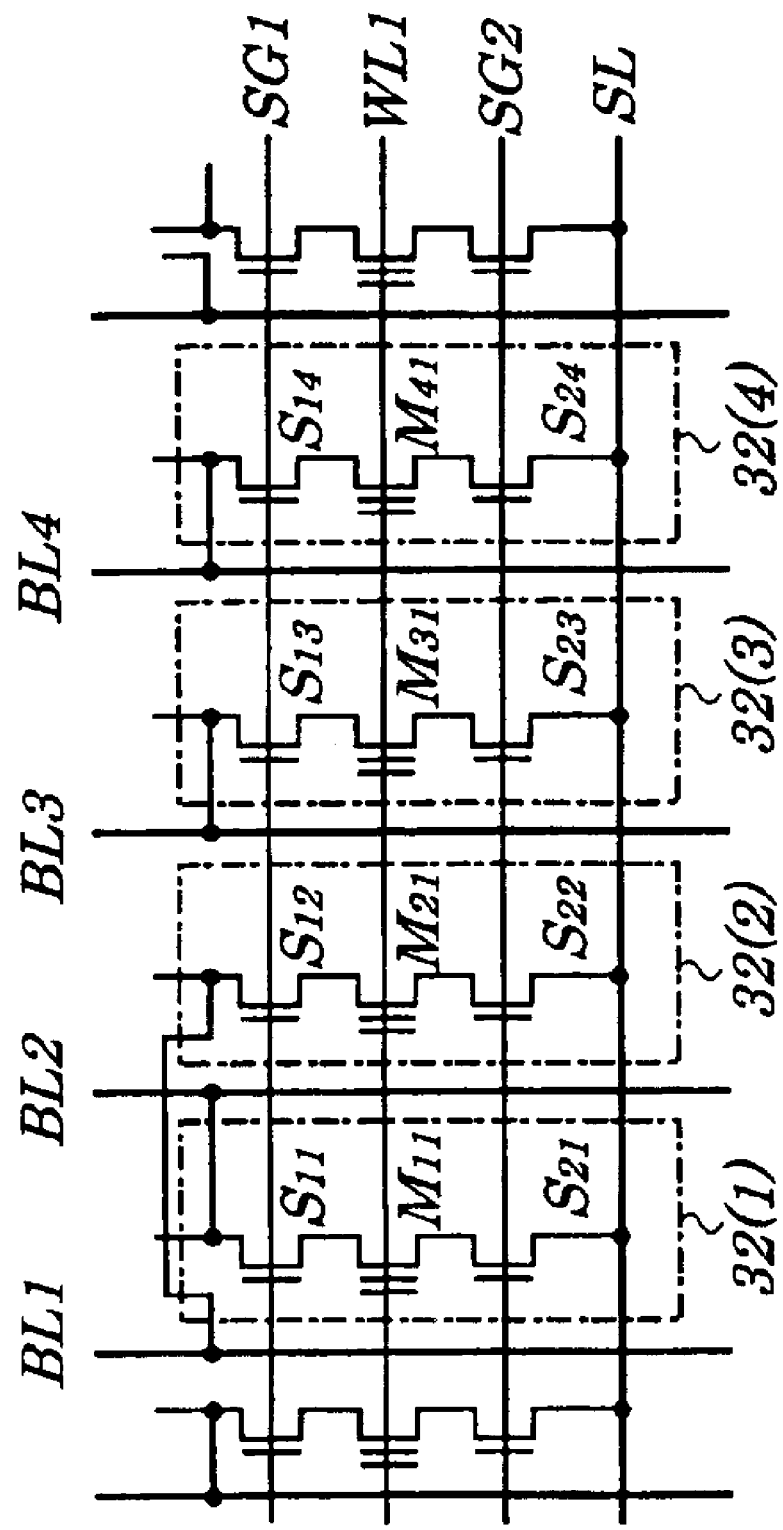
FIG. 9 is a circuit diagram of a memory cell array of a non-volatile memory in a semiconductor device according to a fourth embodiment of the invention.

Referring to FIG. 9, the semiconductor device 1 comprises a 3-transistor NAND type EEPROM. A memory cell array 3 of the NAND type EEPROM is constituted by a plurality of memory cell units 32 arranged in the first and second directions.

Each memory cell unit 32 includes one memory cell M, and two cell selecting transistors $S_1$ ($S_{11}$ to $S_{14}$) and $S_2$ ($S_{21}$ to $S_{24}$) positioned at the opposite sides of the memory cell M and connected in series. In the other respects, the configuration and operation of the NAND type EEPROM of this embodiment are identical to those of the NAND type EEPROM 2 of the first embodiment, and will not be described here.

The NAND type EEPROM of this embodiment is as effective and advantageous as the NAND type EEPROM 2 of the first embodiment.

Fifth Embodiment of the Invention

This embodiment relates to a semiconductor device 1, in which equalized parasitic capacitance is applied to bit lines in a NAND type EEPROM 2, which is essentially identical to the non-volatile memory employed in the first embodiment.

[Configuration of Memory Cell Array]

Figure 10:
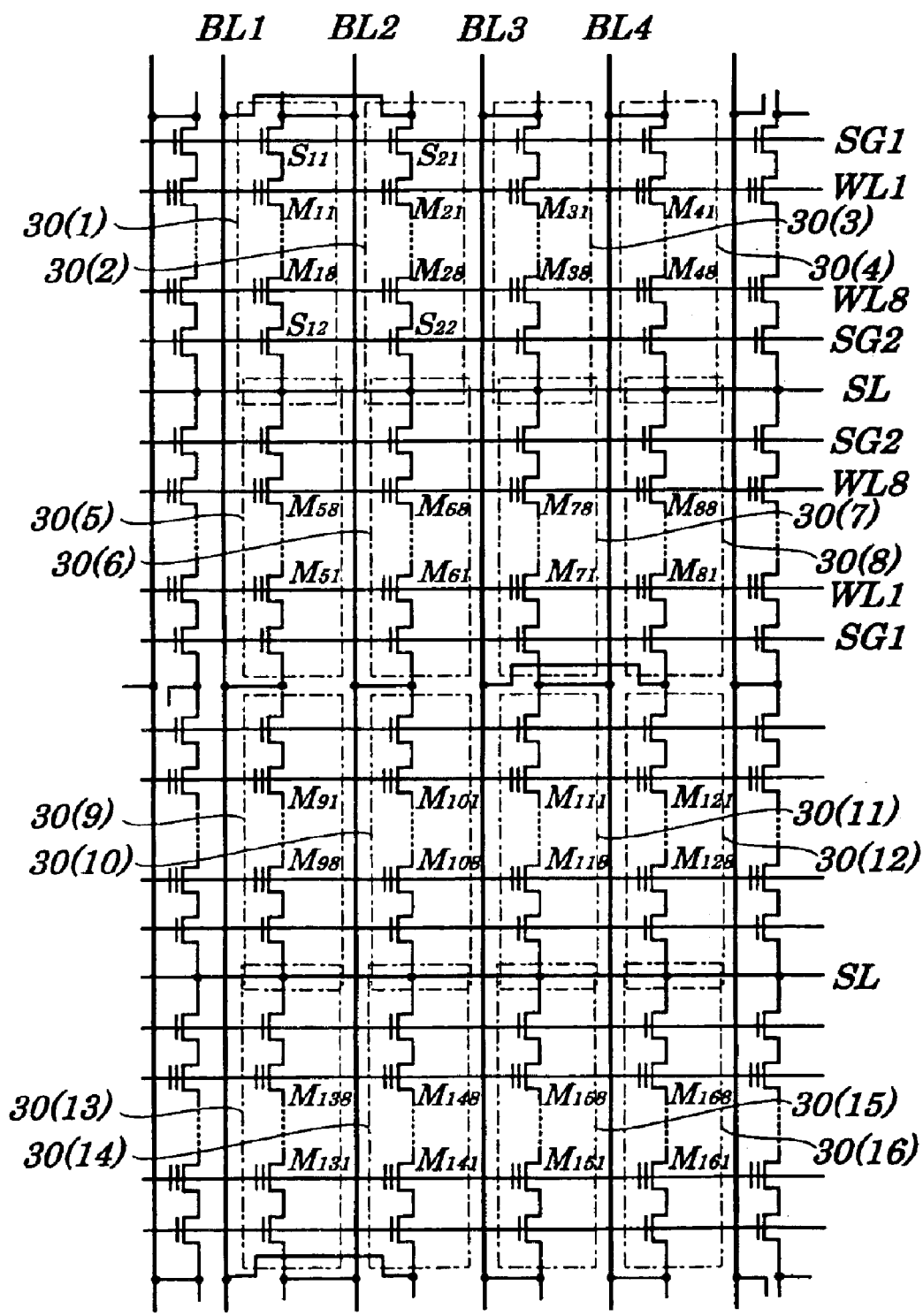
FIG. 10 is a circuit diagram of a memory cell array of a non-volatile memory in a semiconductor device according to a fifth embodiment of the invention.
Figure 11:
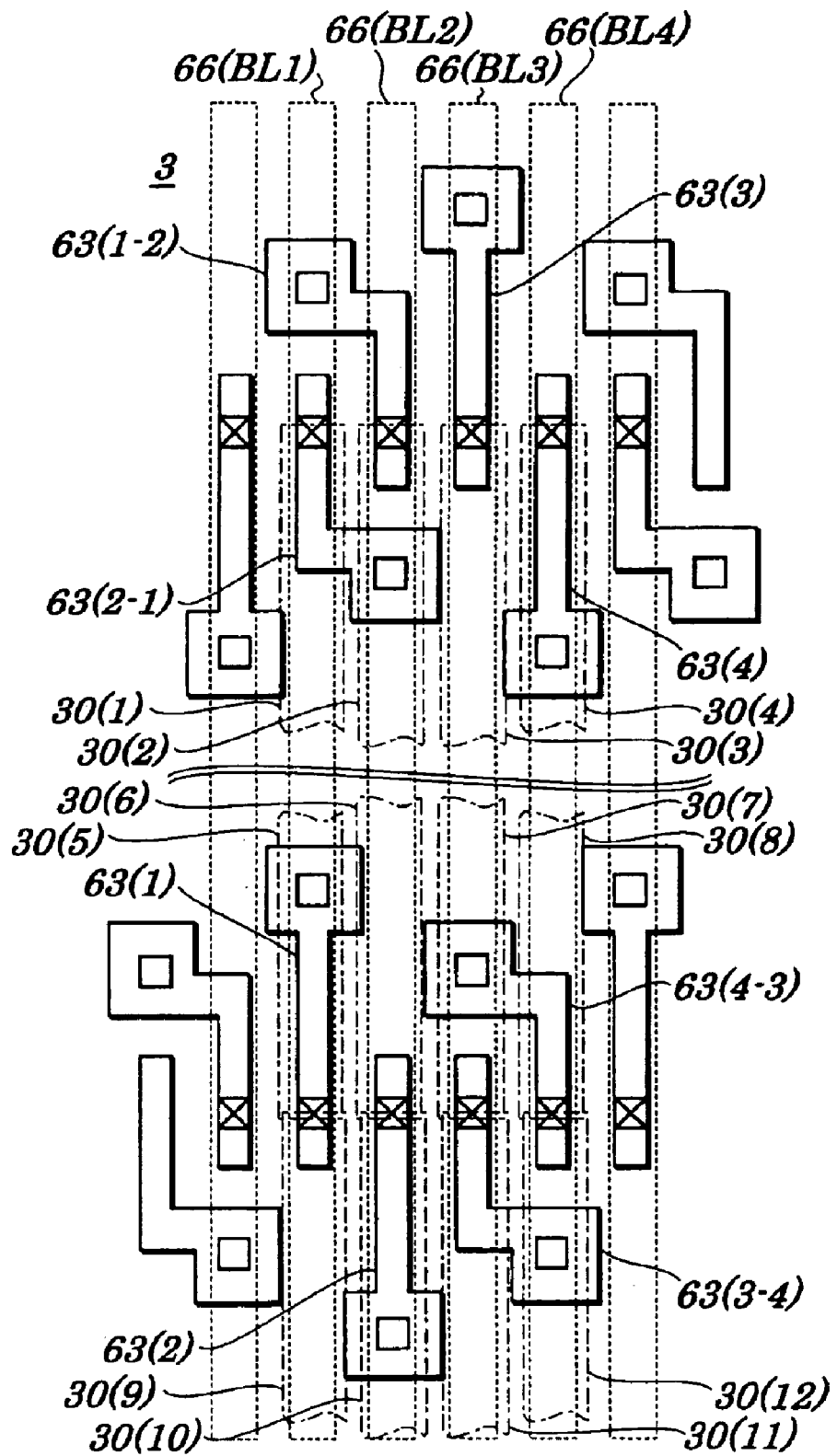
FIG. 11 is a plan view of an essential part of the memory cell array of the non-volatile memory of FIG. 10.

The NAND type EEPROM 2 is configured such that the equalized parasitic capacitance is applied to the bit lines, as shown in FIG. 10 and FIG. 11. The semiconductor device 1 comprises: first to fourth memory cell units 30(1) to 30(4) arranged in the first direction and including memory cells M; fifth to eighth memory cell units 30(5) to 30(8) arranged in the first direction and including memory cells M; a first bit line 66 (BL1) extending over the first and fifth memory cell units 30(1) and 30(5) in the second direction (vertically in FIG. 10 and FIG. 11) and connected to memory cells $M_{21}$ to $M_{28}$ of the second memory cell unit 30(2) and to memory cells $M_{51}$ to $M_{58}$ of the fifth memory cell unit 30(5); a second bit line 66 (BL2) extending over the second and sixth memory cell units 30(2) and 30(6) in the second direction and connected to memory cells $M_{11}$ to $M_{18}$ of the first memory cell unit 30(1) and to memory cells $M_{61}$ to $M_{68}$ of the sixth memory cell unit 30(6); a third bit line 66 (BL3) extending over the third and seventh memory cell units 30(3) and 30(7) in the second direction and connected to memory cells $M_{31}$ to $M_{38}$ of the third memory cell unit 30(3) and to memory cells $M_{81}$ to $M_{88}$ of the eighth memory cell unit 30(8); and a fourth bit line 66 (BL4) extending over the fourth and eighth memory cell units 30(4) and 30(8) in the second direction and connected to memory cells $M_{41}$ to $M_{48}$ of the fourth memory cell unit 30(4) and to memory cells $M_{71}$ to $M_{78}$ of the seventh memory cell unit 30(7).

In the NAND type EEPROM 2 of this embodiment, each of the memory cell units 30(1), 30(2), . . . includes a total of eight memory cells M connected in series. For instance, the eight memory cells $M_{11}$ to $M_{18}$ of the memory cell unit 30(1) are provided between the cell selecting transistor $S_{11}$ whose drain region is connected to the bit line BL2 and the cell selecting transistor $S_{12}$ whose source region is connected to the source line SL. The source region of the cell selecting transistor $S_{11}$ is connected to the drain region of the memory cell $M_{11}$. The drain region of the cell selecting transistor $S_{12}$ is connected to the source region of the memory cell $M_{18}$. The remaining memory cell units 30(2), 30(3) and so on are structured similarly to the memory cell unit 30(1).

In the NAND type EEPROM 2, the memory cells $M_{11}$ to $M_{18}$ of (4n (n: natural number))th and (4n+1)th memory cell unit 30(1), which is arranged in the second direction and are under bit lines 66 (BL1), is connected to the bit line 66 (BL2). The memory cells $M_{21}$ to $M_{28}$ of (4n)th and (4n+1)th memory cell unit 30(1), which is arranged in the second direction and is under bit lines 66 (BL2), are connected to the bit line 66 (BL1). The memory cells $M_{11}$ to $M_{18}$ and the memory cells $M_{21}$ to $M_{28}$ are connected to the bit lines 66 (BL1 and BL2) in a twisted state via the sub-bit lines 62(1-2) and 63(2-1).

The memory cells $M_{71}$ to $M_{78}$ and memory cells $M_{111}$ to $M_{118}$ of (4n+2)th and (4n+3)th memory cell units 30(7) and 30(11), which are arranged in the second direction and are under bit lines 66 (BL3), are connected to the bit line 66 (BL4). The memory cells $M_{81}$ to $M_{88}$ and memory cells $M_{121}$ to $M_{128}$ of (4n+2)th and (4n+3)th memory cell units 30(8) and 30(12), which are arranged in the second direction and are under bit line 66 (BL4), are connected to the bit line 66 (BL3). The memory cells $M_{81}$ to $M_{88}$ and the memory cells $M_{121}$ to $M_{128}$ are connected to the bit lines 66 (BL3 and BL4) in a twisted state via the sub-bit lines 62(3-4) and 63(4-3).

The four bit lines 66 (BL1) to 66(BL4) constitute a minimum basic pattern unit in the first direction, and the sub-bit lines 63(1-2) and 63(2-1) are provided at predetermined intervals in the second direction in order to alternate the bit lines 66 (BL1) and 66 (BL2). Further the sub-bit lines 63(3-4) and 63(4-3) are provided at predetermined intervals in the second direction in order to alternate the bit lines 66 (BL3) and 66 (BL4). In other words, parasitic capacitance which is generated between the bit lines 66 and the sub-bit lines 63 varies with changes of shapes of the alternated bit lines 66 adjacent in the first direction and the sub-bit lines. However, variable parasitic capacitance applied to the bit lines 66 can be equalized in each of the bit lines 66 (BL1) to (BL4). This is effective in improving noise resistance, accelerating the operation speed, and improving performance of the semiconductor device 1.

[Example of Modified Layout of Memory Cell Array]

A modified example of memory cell arrays differs from the memory cell arrays of the fifth embodiment in the following respects. In this example, the four bit lines 66 (BL1) to 66 (BL4) constitute a minimum basic pattern to be repeated. The bit lines 66 (BL1) and 66 (BL2), bit lines 66 (BL2) and 66 (BL3), bit lines 66 (BL3) and 66 (BL4), and bit lines 66 (BL4) and 66 (BL1) are alternated at the predetermined intervals.

Figure 12:
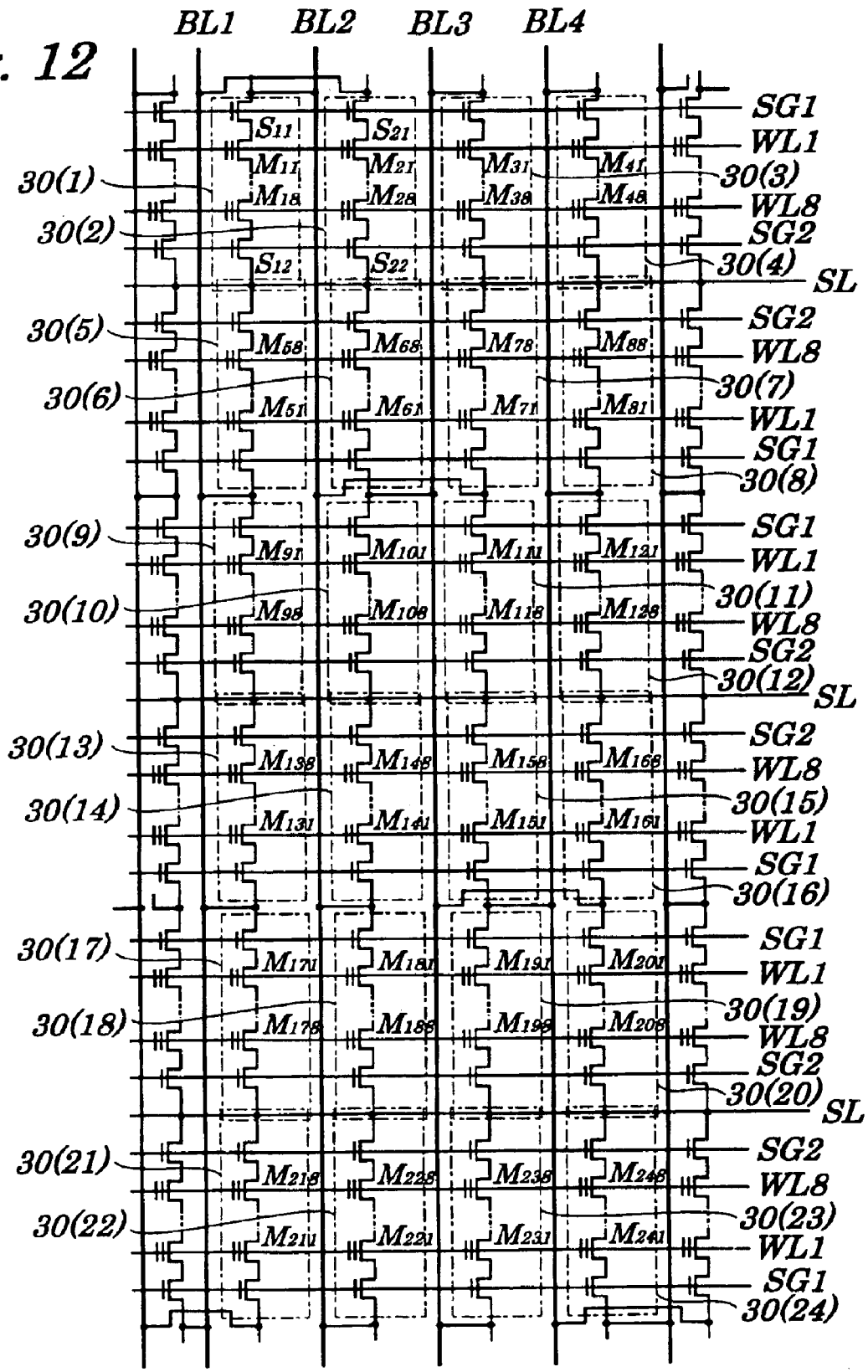
FIG. 12 is a circuit diagram of a memory cell array of a non-volatile memory in a semiconductor device in a modified example of the fifth embodiment of the invention.
Figure 13:
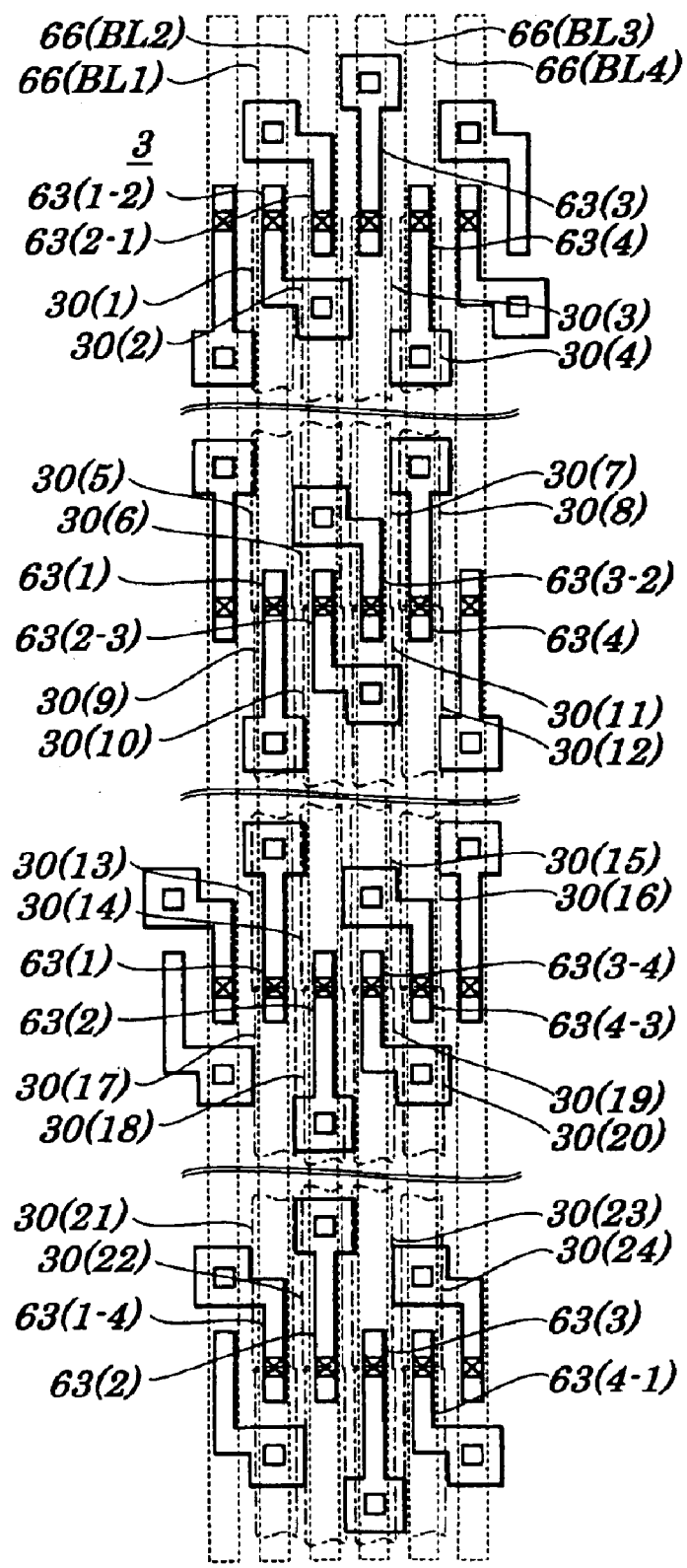
FIG. 13 is a plan view of an essential part of the memory cell array of the non-volatile memory of FIG. 12.

Referring to FIG. 12 and FIG. 13, the semiconductor device 1 comprises: first to fourth memory cell units 30(1) to 30(4) arranged in the first direction and including memory cells M; fifth to eighth memory cell units 30(9) to 30(12) (or 30(5) to 30(8)) arranged in the first direction and including memory cells M; ninth to twelfth memory cell units 30(17) to 30(20) (or 30(13) to 30(16)) arranged in the first direction and including memory cells M; first bit line 66 (BL1) extending over the first, fifth and ninth memory cell units 30(1), 30(9) and 30(17) in the second direction (vertically in FIG. 12 and FIG. 13) and connected to the memory cells $M_{21}$ to $M_{28}$ of the second memory cell unit 30(2), memory cells $M_{91}$ to $M_{98}$ of the fifth memory cell unit 30(9), and memory cells $M_{171}$ to $M_{178}$ of the ninth memory cell unit 30(17); second bit line 66 (BL2) extending on the second, sixth and tenth memory cell units 30(2), 30(10) and 30(18) in the second direction and connected to the memory cells $M_{11}$ to $M_{18}$ of the first memory cell unit 30(1), memory cells $M_{111}$ to $M_{118}$ of the seventh memory cell unit 30(11), and memory cells $M_{181}$ to $M_{188}$ of the tenth memory cell unit 30(18); third bit line 66 (BL3) extending on the third, seventh and eleventh memory cell units 30(3), 30(11) and 30(19) in the second direction and connected to the memory cells $M_{31}$ to $M_{38}$ of the third memory cell unit 30(3), memory cells $M_{101}$ to $M_{108}$ of the sixth memory cell unit 30(10), and memory cells $M_{201}$ to $M_{208}$ of the twelfth memory cell unit 30(20); and fourth bit line 66 (BL4) extending over the fourth, eighth and twelfth memory cell units 30(4), 30(12) and 30(20) in the second direction and connected to the memory cells $M_{41}$ to $M_{48}$ of the fourth memory cell unit 30(4), memory cells $M_{121}$ to $M_{128}$ of the eighth memory cell unit 30(12), and memory cells $M_{191}$ to $M_{198}$ of the eleventh memory cell unit 30(19).

Each of the memory cell units 30(1), 30(2), . . . includes a total of eight memory cells M connected in series. For instance, the memory cells $M_{11}$ to $M_{18}$ of the memory cell unit 30(1) are provided between the cell selecting transistor $S_{11}$ whose drain region is connected to the bit line BL2 and the cell selecting transistor $S_{12}$ whose source region is connected to a source line SL. A source region of the cell selecting transistor $S_{11}$ is connected to a drain region of the memory cell $M_{11}$. A drain region of the cell selecting transistor $S_{12}$ is connected to a source region of the memory cell $M_{18}$. The remaining memory cell units 30(2), 30(3), . . . are structured similarly to the memory cell unit 30(1).

In other words, the memory cells $M_{11}$ to $M_{18}$ of (8n (n: natural number))th and (8n+1)th memory cell unit 30(1), which is arranged in the second direction and is positioned under the first bit line 66 (BL1) are connected to the second bit line 66 (BL2). The memory cells $M_{21}$ to $M_{28}$ of (8n)th and (8n+1)th memory cell unit 30(2), which is arranged in the second direction and is positioned under the second bit line 66 (BL2), are connected to the first bit line 66 (BL1). The bit lines 66 (BL1 and BL2) are connected in a twisted state via the sub-bit lines 63(1-2) and 63(2-1).

The memory cells $M_{61}$ to $M_{68}$ and $M_{101}$ to $M_{108}$ of (8n+2)th and (8n+3)th memory cell units 30(6) and 30(10), which are arranged in the second direction and are positioned under the second bit line 66 (BL2), are connected to the third bit line 66 (BL3). The memory cells $M_{71}$ to $M_{78}$ and $M_{111}$ to $M_{118}$ of (8n+2)th and (8n+3)th memory cell units 30(7) and 30(11), which are arranged in the second direction and are positioned under the third bit line 66 (BL3), are connected to the second bit line 66 (BL2). The bit lines 66 (BL2 and BL3) are connected in a twisted state via the sub-bit lines 63(2-3) and 63(3-2).

The memory cells $M_{151}$ to $M_{158}$ and $M_{191}$ to $M_{198}$ of (8n+4)th and (8n+5)th memory cell units 30(15) and 30(19), which are arranged in the second direction and are positioned under the third bit line 66 (BL3), are connected to the fourth bit line 66 (BL4). The memory cells $M_{161}$ to $M_{168}$ and $M_{201}$ to $M_{208}$ of (8n+4)th and (8n+5)th memory cell units 30(16) and 30(20), which are arranged in the second direction and are positioned under the fourth bit line 66 (BL4) are connected to the third bit line 66 (BL3). The bit lines 66 (BL3 and BL4) are connected in a twisted state via the sub-bit lines 63(3-4) and 63(4-3).

The memory cells $M_{241}$ to $M_{248}$ of (8n+6)th and (8n+7)th memory cell unit 30(24), which is arranged in the second direction and is positioned under the fourth bit line 66 (BL4), are connected to the first bit line 66 (BL1). The memory cells $M_{11}$ to $M_{18}$ of (8n+6)th and (8n+7)th memory cell unit 30(1), which is arranged in the second direction and is positioned under the first bit line 66 (BL1), are connected to the fourth bit line 66 (BL4). The bit lines 66 (BL4 and BL1) are connected in a twisted state via the sub-bit lines 63(4-1) and 63(1-4).

The four bit lines 66 (BL1) to 66(BL4) constitute a minimum basic pattern in the first direction, and the sub-bit lines 63(1-2) and 63(2-1) are provided at predetermined intervals in the second direction in order to alternate the bit lines 66 (BL1) and 66 (BL2). The sub-bit lines 63(2-3) and 63(3-2) are provided at predetermined intervals in the second direction in order to alternate the bit lines 66 (BL2) and 66 (BL3). The sub-bit lines 63(3-4) and 63(4-3) are provided at predetermined intervals in the second direction in order to alternate the bit lines 66 (BL3) and 66 (BL4). Further, the sub-bit lines 63(4-1) and 63(1-4) are provided at predetermined intervals in the second direction in order to alternate the bit lines 66 (BL4) and 66 (BL1). In other words, parasitic capacitance which is generated between the bit lines 66 and the sub-bit lines 63 varies with changes of shapes of the alternated bit lines 66 adjacent in the first direction and sub-bit lines 63. However, variable parasitic capacitance applied to the bit lines 66 can be equalized in each of the bit lines 66 (BL1) to (BL4). This is effective in improving noise resistance, accelerating the operation speed and improving performance of the semiconductor device 1.

Sixth Embodiment of the Invention

This embodiment of the invention relates to a semiconductor device 1 including a NAND type EEPROM in order to write multiple, or ternary or more, data.

[System Configuration of NAND Type EEPROM]

Figure 14:
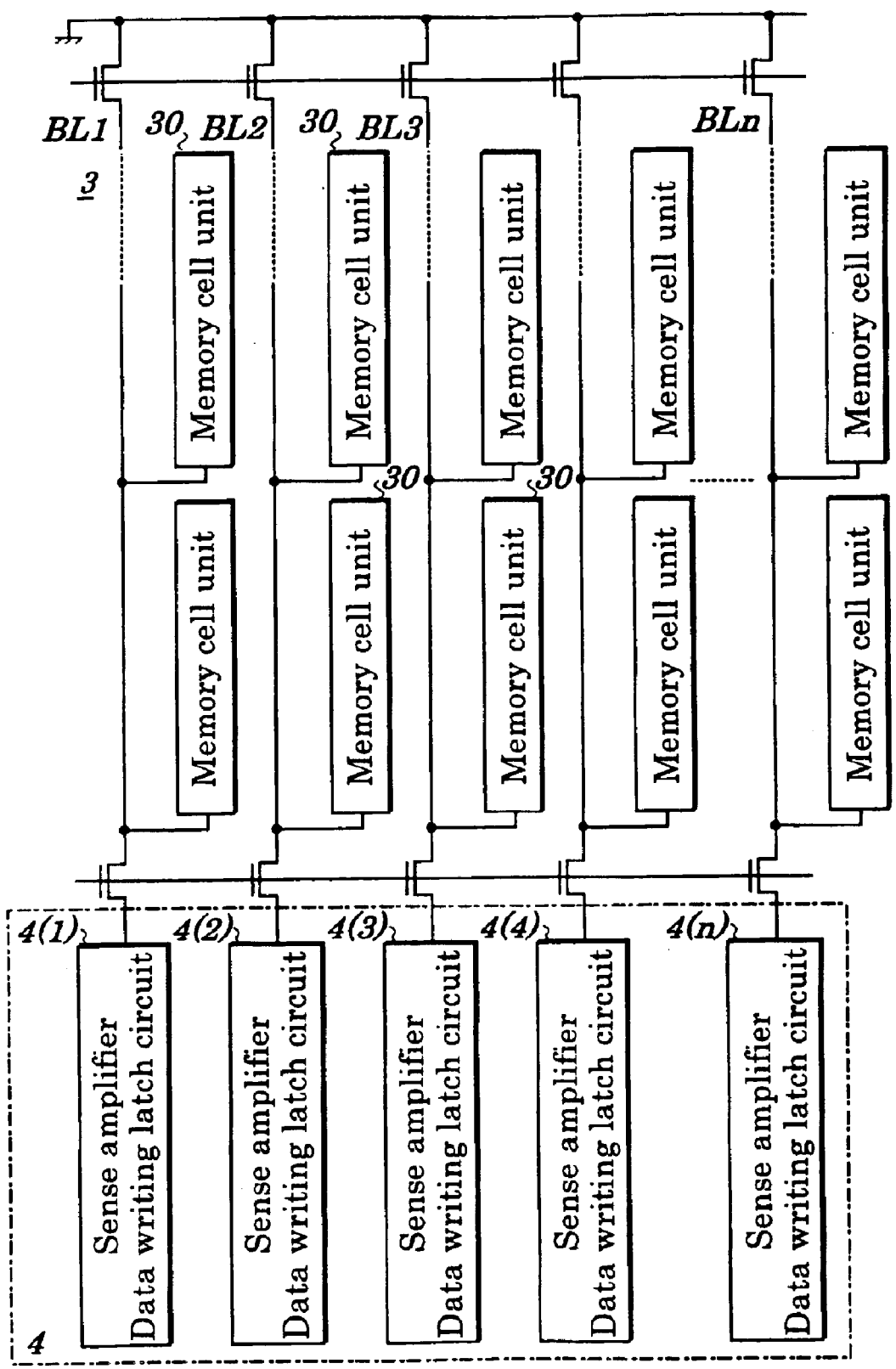
FIG. 14 is a system block diagram of a non-volatile memory of a semiconductor device according to a sixth embodiment of the invention.
Figure 15:
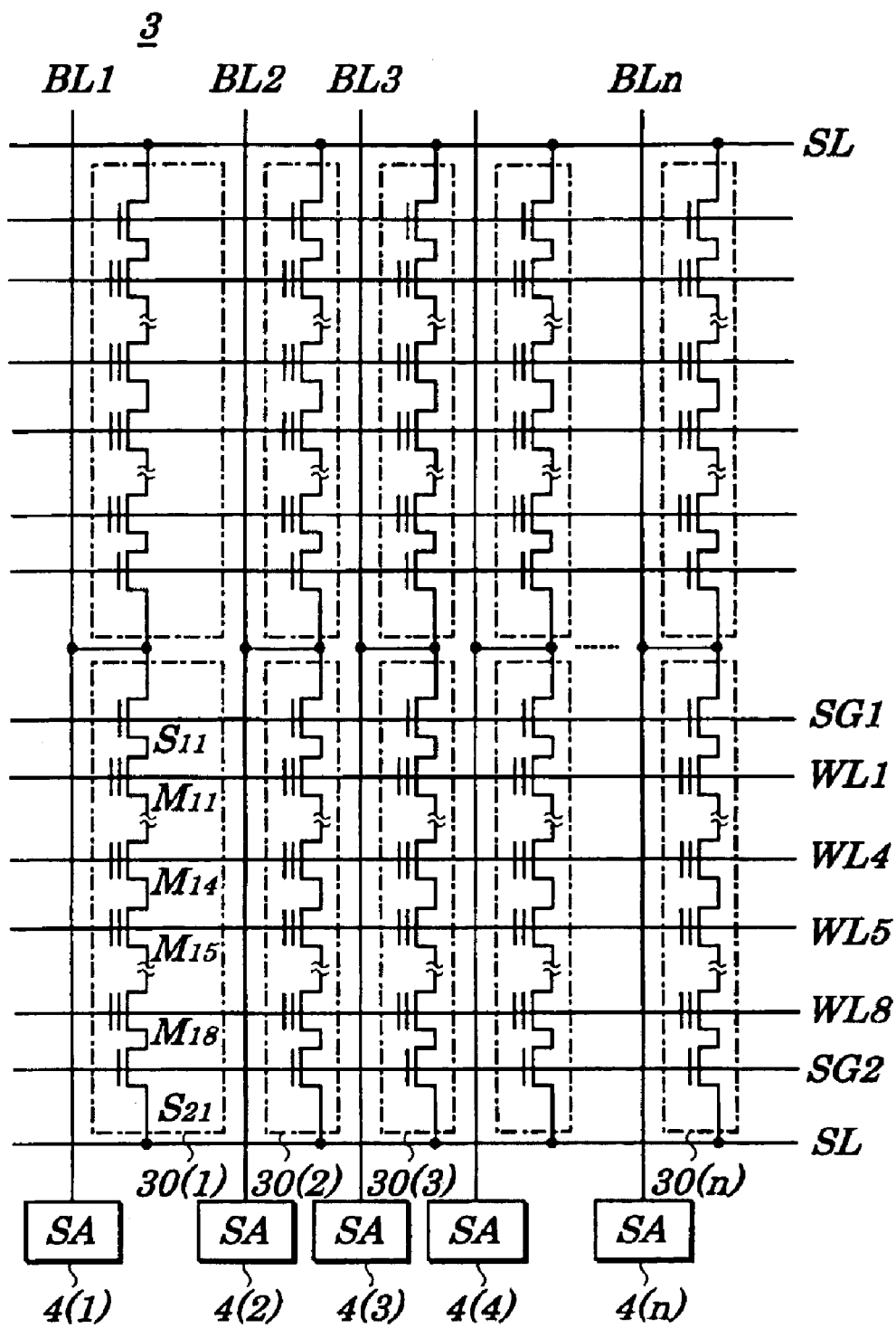
FIG. 15 is a circuit diagram of the memory cell array of the non-volatile memory of FIG. 14.

Referring to FIG. 14 and FIG. 15, the semiconductor device 1 comprises a NAND type EEPROM which is identical to the NAND type EEPROM 2 of the first embodiment. This NAND type EEPROM includes at least: memory cell arrays 3 each of which is constituted by a plurality of memory cells M arranged in the shape of a matrix and is capable of storing ternary or more data "m"; a plurality of word lines WL extending over the memory cell arrays 3 in the first direction and arranged in the second direction; a plurality of bit lines BL extending over the memory cell arrays 3 in the second direction and arranged in the first direction; a plurality of sense amplifiers 4 provided for the bit lines on one to one basis; and a plurality of data writing latch circuits 4 provided for the sense amplifiers 4 on one to one basis.

Figure 16:
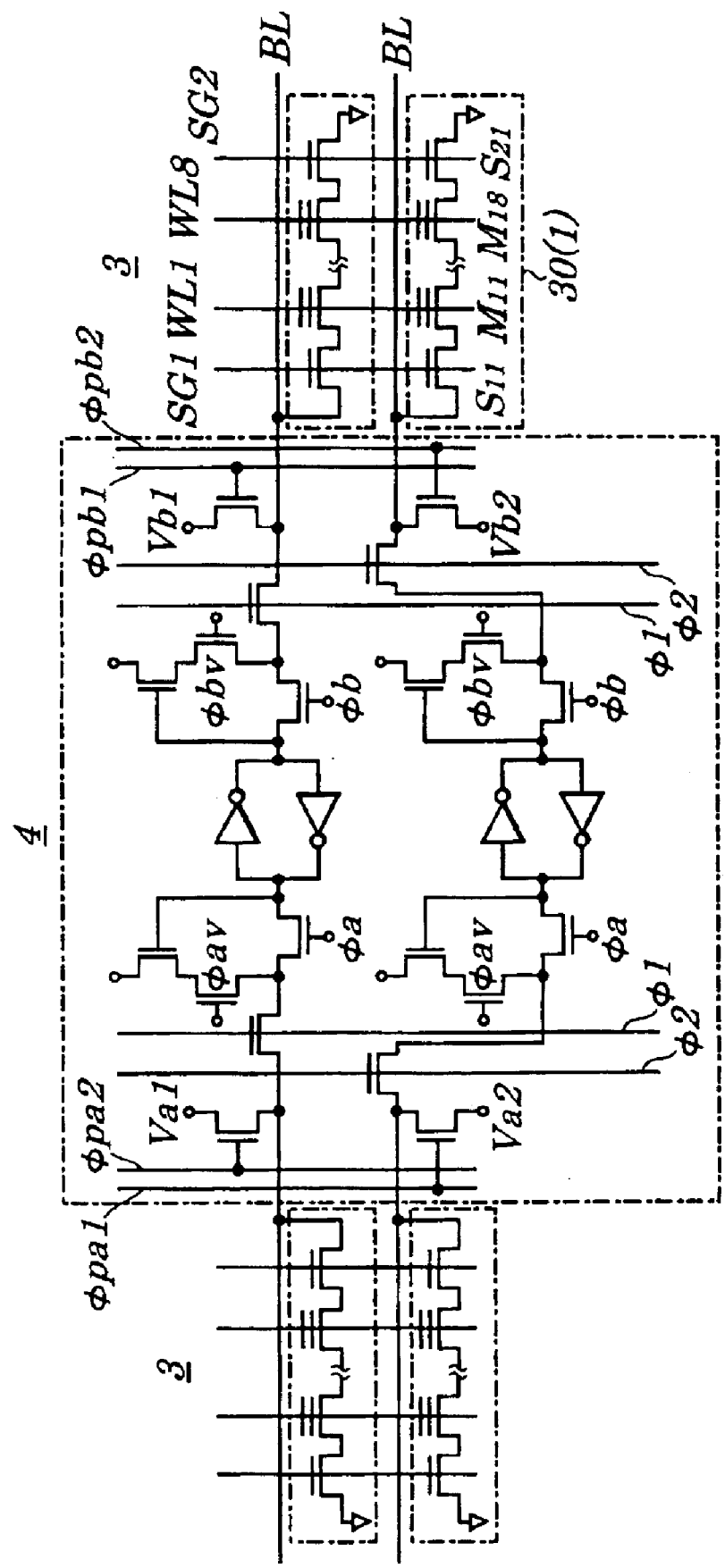
FIG. 16 is a diagram showing a peripheral circuit of the non-volatile memory of FIG. 14.

Referring to FIG. 16, "n" (where $2^{n-1} \subset M \subseteq 2^n$) data writing latch circuits 4 are provided for the bit lines BL1, BL2, . . . BLn. During the data writing, data are transmitted from a data input-output buffer 7 (shown in FIG. 6(A)) to the data writing latch circuits 4, which applies a potential to the bit lines in response to the received data.

[Operation of NAND Type EEPROM]

The data are written into the NAND type EEPROM which can store multiple data, as shown in FIG. 17(A) to FIG. 17(D) and FIG. 18.

Figure 17:
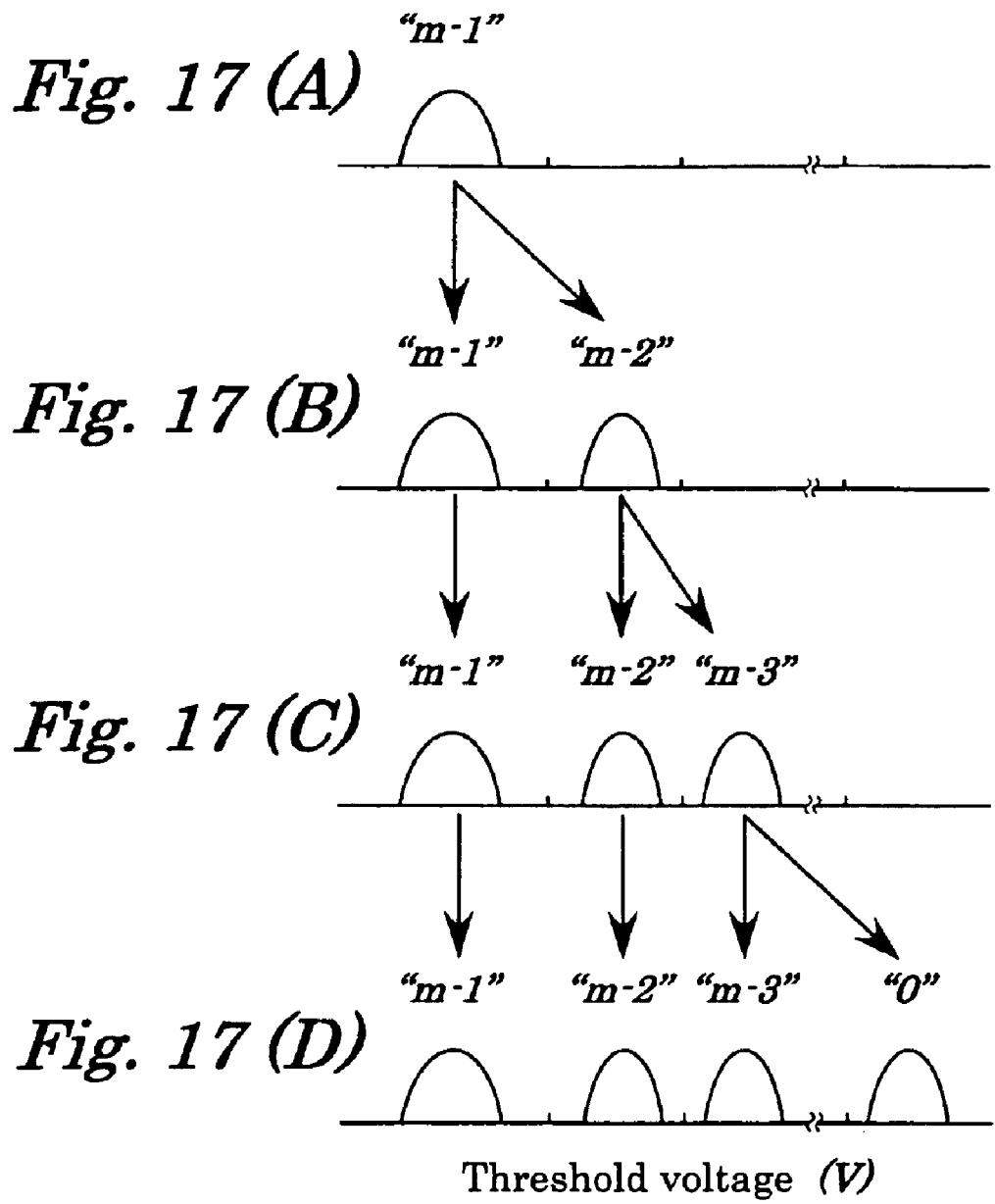
FIG. 17(A) to FIG. 17(D) show transitions of threshold voltages of a memory cell during data writing, in the non-volatile memory of the sixth embodiment.
Figure 18:
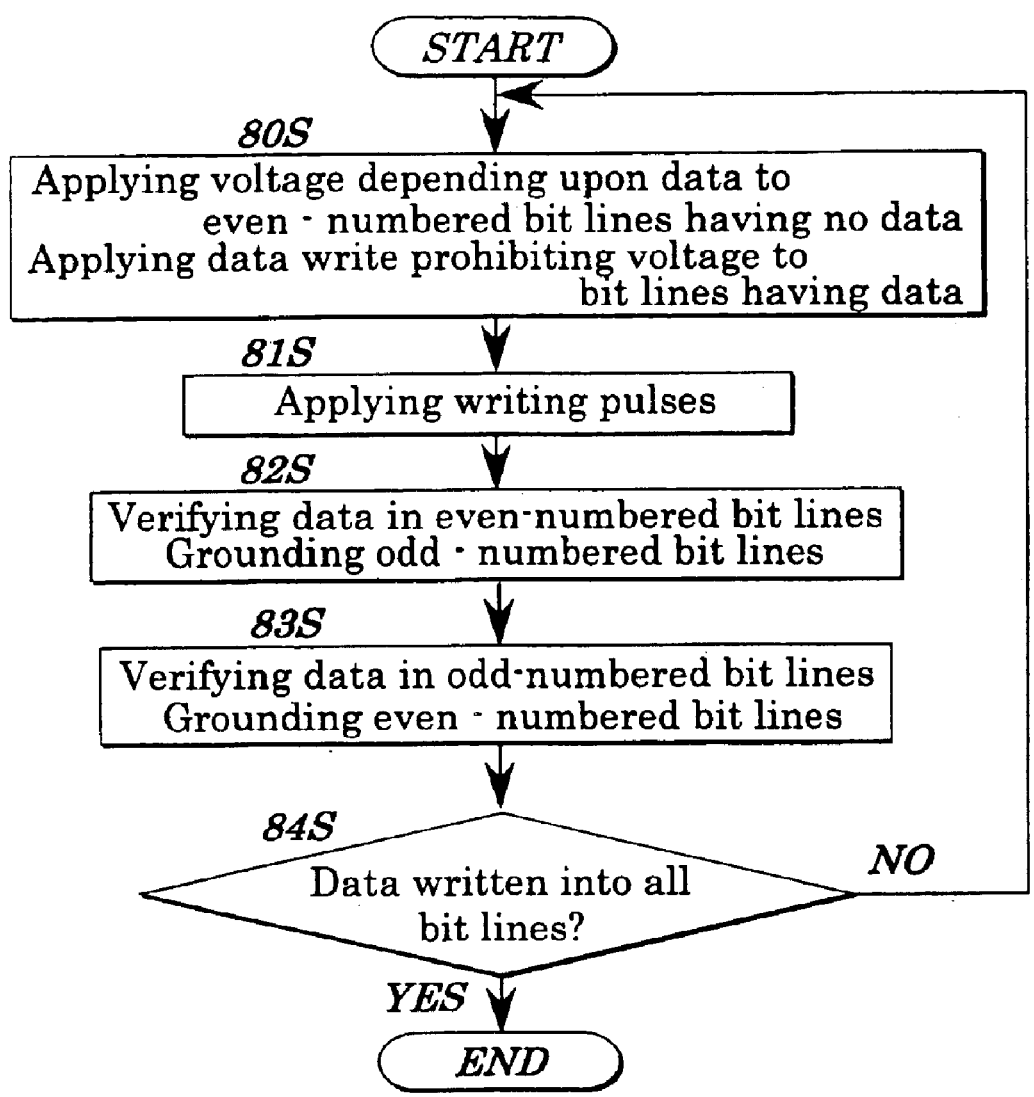
FIG. 18 is flow chart showing the operation of the non-volatile memory of the sixth embodiment.
Figure 19:
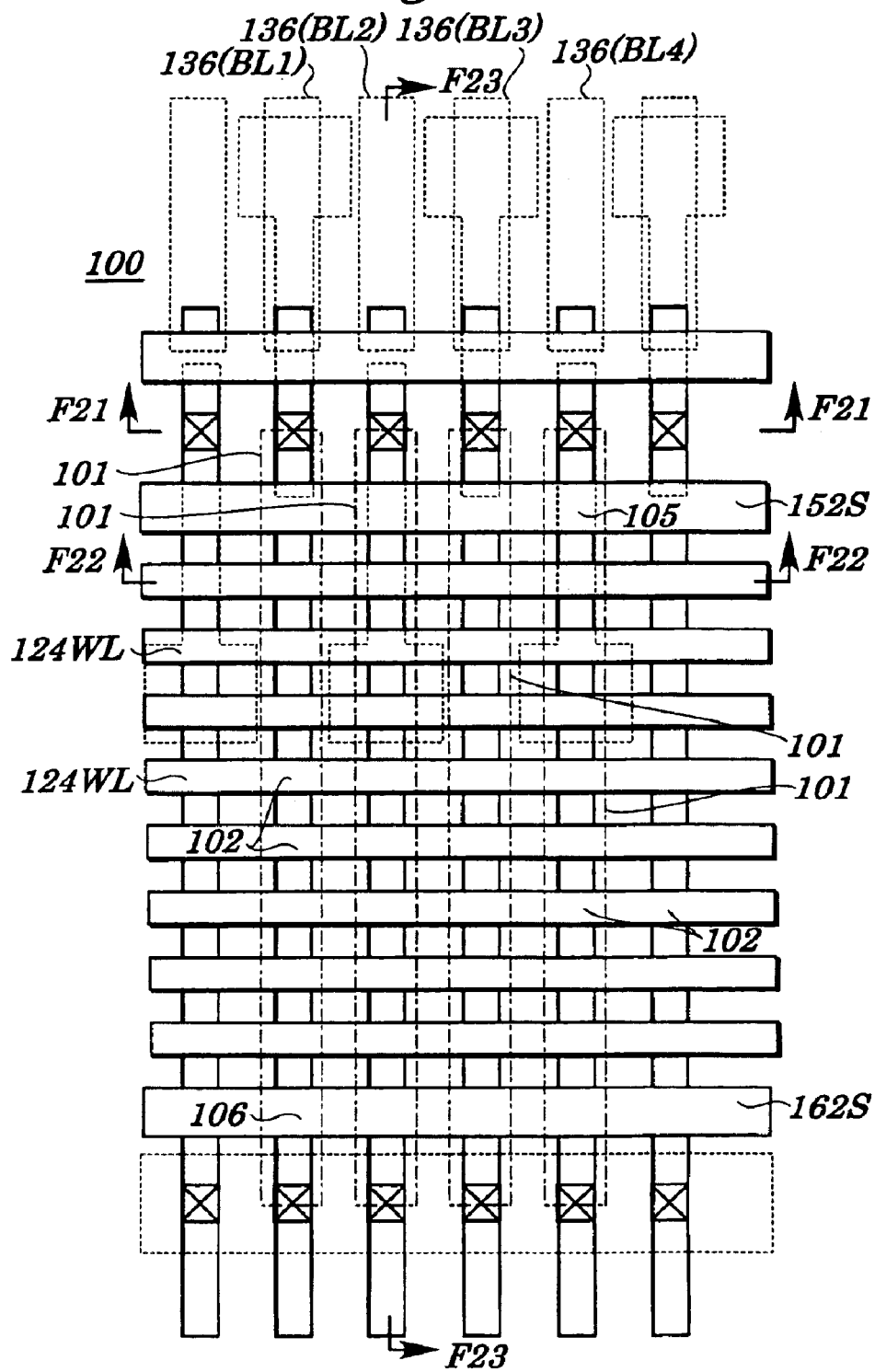
FIG. 19 is a plan view of an essential part of a memory cell array in a semiconductor device of the related art.
Figure 22:
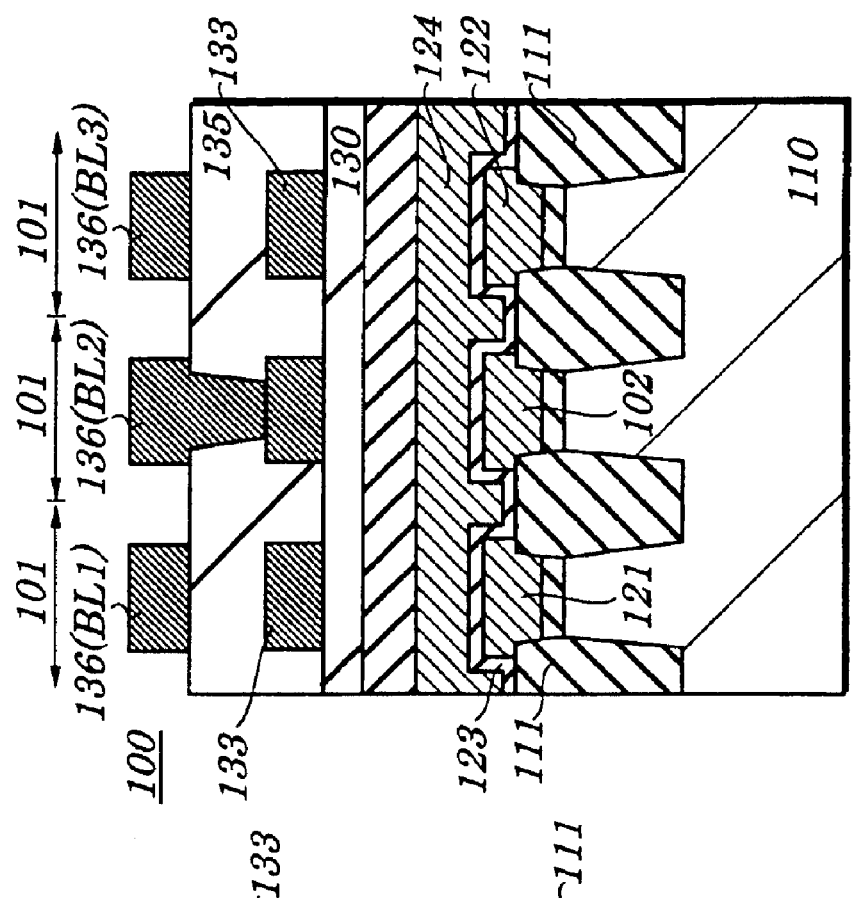
FIG. 22 is a cross section of the semiconductor device, taken along line F22—F22.
Figure 21:
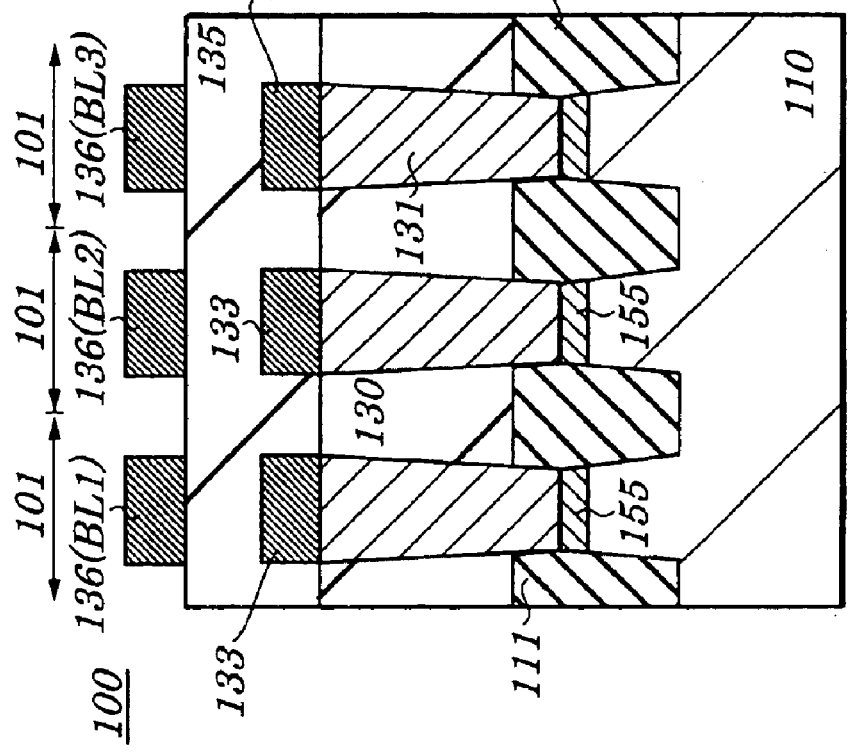
FIG. 21 is a cross section of the semiconductor device, taken along line F21—F21 in FIG. 19 and FIG. 20.
Figure 23:
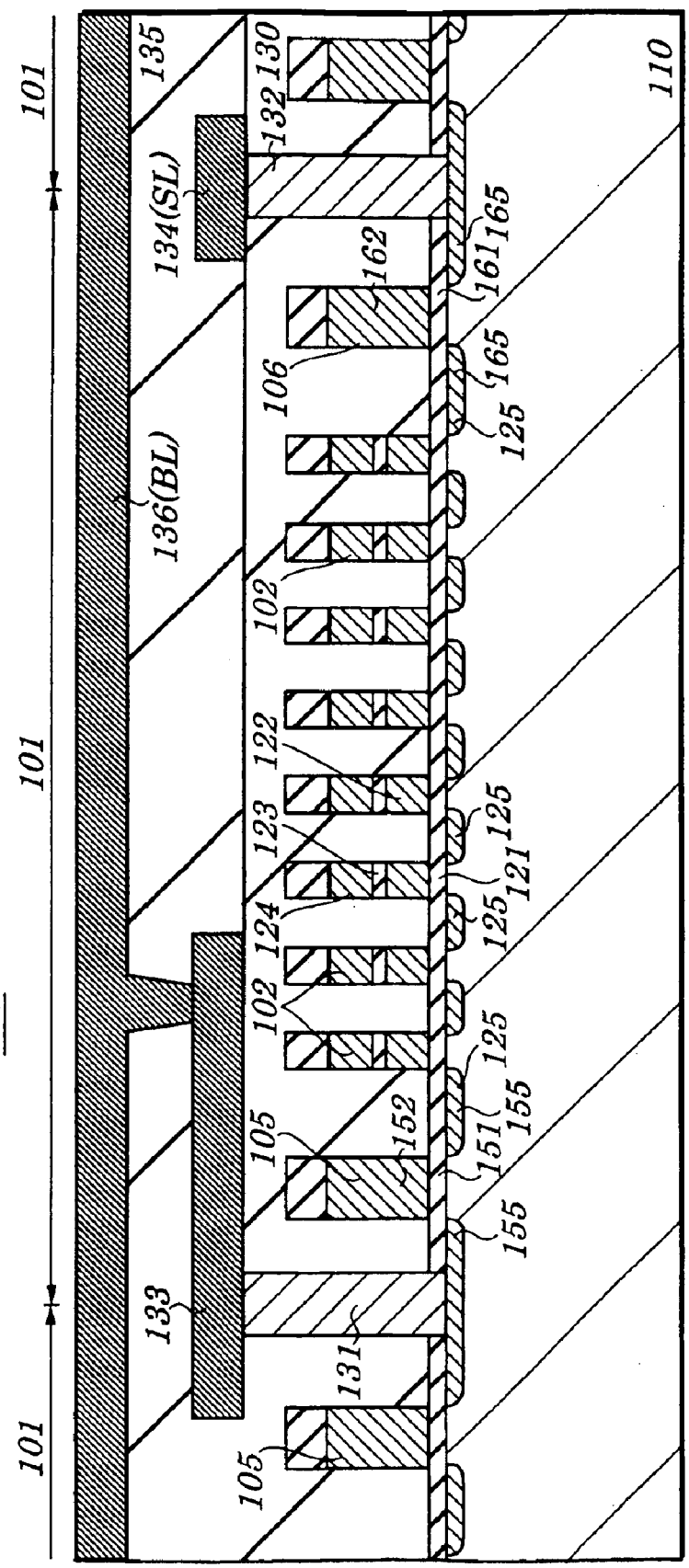
FIG. 23 is a cross section of the semiconductor device, taken along line F23—F23 in FIG. 19 and FIG. 20.

(1) A method of data writing is determined. Each memory cell can store multiple data, e.g. quadruple data, as shown in FIG. 17(D). It is assumed here that data m refers to a threshold voltage when the memory cells M are in an initialized state, data "m−1" refers to a minimum threshold voltage during the data writing, data "m−2" refer to a second minimum threshold voltage, . . . and data "0" refers to a maximum threshold voltage.

(2) Existing data are erased in the memory cells M in order to initialize them, i.e. the data "m−1" are written into all of the memory cells M.

(3) The data are written into the selected memory cell m−1 times (steps 80S and 81S). Writing of the data "m" (=data "0") is started at memory cells M having a low threshold voltage and is continued to memory cells M having a high threshold voltage.

For instance, when the threshold voltage is set to the initial value m−1 by the initialization, the data "m−2" are written first of all into the target memory cell M where the data "m−2" should be written. In this case, the data "m−2" are also written into the memory cells M where the data "0" should be written, and the memory cells M where the data "m−3" should be written. In short, the data "m−2" are written into all of the memory cells M connected to one word line WL. Zero V is applied to a bit line BL to which the foregoing memory cells M are connected. The memory cell M storing the data "m−1" applies to the bit line BL a certain positive potential which is lower than a positive potential applied to the selected word line WL. Therefore, no electrons will be introduced into the floating gate electrode from the channel forming region.

(4) The written data are separately verified for the odd-numbered and even-numbered memory cells M connected to one word line WL (steps 82S and 83S). Thereafter, the data "m−3" will be written into the memory cells M. Specifically, 0V is applied to the bit line BL which is connected to the memory cell M where the data "m−3" should be written over the data "0" while a certain positive potential, which is higher than a positive potential to be applied to the selected word line WL, is applied to the bit line BL where the memory cells M storing the data "m−1" and "m−2". After the verification, the data "0" will be written into the memory cells M.

The data "0" are written into the memory cells M whose threshold voltage is the lowest (in the erased state), into the memory cells whose threshold voltage is secondly lowest, and into the memory cells M whose threshold voltage is thirdly lowest. In other words, the data are completely written into all of the memory cells M m−1 times (step S83).

In the sixth embodiment, it is possible to reduce a varying amount of apparent threshold voltage of the memory cells M due to the coupling capacitance. For instance, when data are written into odd-numbered memory cells M connected to one bit line and then the data are written into even-numbered memory cells M connected to the same bit line, the threshold voltage of the odd-numbered memory cells M seem to vary. In the case of memory cells M capable of storing multiple data, when data are written into the even-numbered memory cells M where data should be written later, i.e. when the minimum threshold voltage changes to the maximum threshold voltage, the threshold voltage of the odd-numbered memory cells M where the data should be written first seem to change excessively.

With the sixth embodiment, the multiple data are simultaneously written into adjacent memory cells M. Thereafter, the data are sequentially written into memory cells M having lower threshold voltages, so that it is possible to minimize variations of the threshold voltages in adjacent memory cells M. This is effective in reducing variations of the threshold voltages of the memory cells M.

The NAND type EEPROM of the embodiment is advantageous in the following respects. When the data are sequentially written into memory cells M connected to one word line WL in a plurality of times (i.e. split data writing), a positive potential is applied from bit lines BL to memory cells M where no data are written, thereby moderating a potential difference between the channel forming region and charging storing section, and preventing electrons from being introduced to the charge storing section from the channel forming region (well region). However, if the data are split-written in the number of times above a certain value, small potential differences may be accumulated, which causes erroneous data writing (writing disturbance).

There is a restriction of the number of split data writing. Generally, data dare separately and sequentially written into odd-numbered and even-numbered memory cells, i.e. twice. When data are written N times, 2N−1 data disturbances will be caused. However, in the sixth embodiment, the data are simultaneously written into odd-numbered and even-numbered memory cells M. If the data are written in N times, there is only N−1 write disturbances. It is possible to prevent erroneous data writing resultant from split data writing.

The NAND type EEPROM of the first embodiment is utilized in the sixth embodiment. Alternatively, the AND type EEPROM of the third embodiment or the 3-transistor NAND type EEPROM of the fourth embodiment is also applicable.

Other Embodiments of the Invention

Although the invention has been described with respect to some embodiments thereof, it will be understood by those skilled in the art that various modifications are possible without departing from the spirit of the present invention.

Electrically writable and erasable EEPROMs have been utilized in the foregoing embodiments. Alternatively, EPROMs which are erasable by ultraviolet rays are also employed in the embodiments of the invention.

The invention provides a semiconductor device which includes a non-volatile memory capable of reducing apparent variations of the threshold voltages of memory cells due to coupling capacitance produced between charge storing sections of adjacent memory cells.

Further, the invention provides a semiconductor device which includes a non-volatile memory in order to reduce variations of parasitic capacitance applied to bit lines in response to varying shapes of sub-bit lines, prevents erroneous operation and is electrically reliable.

Still further, when split-writing data into memory cells, it is possible to protect non-selected memory cells, which are connected to one word line together with memory cells where data should be written, against writing disturbance, and erroneous data writing.

What is claimed is:

1. A semiconductor device having a non-volatile memory, comprising:
   a memory cell array including a plurality of memory cells, each of the memory cells having positive ternary or more data "m", the plurality of memory cells arranged in the shape of a matrix;
   a plurality of word lines connected to said memory cells, extending over said memory cell arrays in a first direction, and arranged in a second direction;
   a plurality of bit lines connected to said memory cells, extending over said memory cell arrays in the second direction, and arranged in the first direction;
   a plurality of sense amplifiers provided for said bit lines on one to one basis; and
   a plurality of latch circuits provided for said sense amplifier on one to one basis,
   wherein the positive ternary or more data "m" are simultaneously written into adjacent memory cells and the data are sequentially written into memory cells having lower threshold voltages.

2. The semiconductor device of claim 1, wherein the non-volatile memory is a NAND type non-volatile memory in which a plurality of memory cells are electrically connected in series between said bit lines and a source line.

3. The semiconductor device of claim 1, wherein the non-volatile memory is an AND type non-volatile memory in which a plurality of memory cells are electrically connected in parallel between said bit lines and a source line.

4. The semiconductor device of claim 1, wherein the semiconductor device:
   initializes all of the memory cells; and
   writes data into the memory cells m−1 times, and
   wherein data written after the initialization are sequentially added to the data written during the initialization.

* * * * *